United States Patent
Inokuma

(10) Patent No.: US 8,822,968 B2
(45) Date of Patent: Sep. 2, 2014

(54) NONVOLATILE MEMORY DEVICE AND METHOD FOR MANUFACTURING SAME

(75) Inventor: Hideki Inokuma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/600,719

(22) Filed: Aug. 31, 2012

(65) Prior Publication Data

US 2013/0248796 A1    Sep. 26, 2013

(30) Foreign Application Priority Data

Mar. 26, 2012   (JP) ................................. 2012-070408

(51) Int. Cl.
*H01L 29/02*       (2006.01)

(52) U.S. Cl.
USPC ............... 257/2; 257/3; 257/4; 257/E45.001; 438/129; 438/197; 438/381; 438/467

(58) Field of Classification Search
USPC ........... 257/1–5, E45.001, E45.002, E45.003; 438/129, 197, 381–382, 385, 467, 241, 438/243–244
See application file for complete search history.

(56) References Cited

U.S. PATENT DOCUMENTS

| | | | |
|---|---|---|---|
| 2009/0309088 A1* | 12/2009 | Sakamoto | ......................... 257/2 |
| 2010/0252798 A1 | 10/2010 | Sumino | |
| 2011/0140065 A1 | 6/2011 | Maesaka et al. | |
| 2011/0175049 A1 | 7/2011 | Yasuda et al. | |
| 2011/0199812 A1 | 8/2011 | Kitagawa et al. | |

FOREIGN PATENT DOCUMENTS

JP    2011-049581    3/2011

* cited by examiner

*Primary Examiner* — Mark A Laurenzi
(74) *Attorney, Agent, or Firm* — Finnegan, Henderson, Farabow, Garrett & Dunner, L.L.P.

(57) ABSTRACT

According to one embodiment, a nonvolatile memory device includes a first wiring layer. The device includes a second wiring layer intersecting with the first wiring layer. And the device includes a first memory layer provided at a position where the first wiring layer and the second wiring layer intersect. And the first memory layer contacts with the first wiring layer, and the first wiring layer is a layer which is capable of supplying a metal ion to the first memory layer.

10 Claims, 23 Drawing Sheets

NONVOLATILE MEMORY DEVICE AND METHOD FOR MANUFACTURING SAME

CROSS-REFERENCE TO RELATED APPLICATION

This application is based upon and claims the benefit of priority from Japanese Patent Application No. 2012-070408, filed on Mar. 26, 2012; the entire contents of which are incorporated herein by reference.

FIELD

Embodiments described herein relate generally to a nonvolatile memory device and a method for manufacturing the same.

BACKGROUND

Conventionally, as a nonvolatile memory device having a large capacity, a NAND type flash memory has been frequently used. However, it is going to be close to a physical limit in connection with a refining of an element, and there have been recently developed new memories such as a ferroelectric memory, a magnetic resistance memory, a phase change memory, a resistance change type memory and the like. Among them, an ion memory is remarked as one of the resistance variable memory, the ion memory being one kind of a conductive bridging random access memory (CBRAM).

A memory cell of the ion memory generally has a rewritable memory layer (a rewritable layer), a metal ion supply layer for introducing a metal atomic element to the rewritable layer, and a facing electrode layer which is arranged in a reverse side to the metal ion supply layer.

In the case that the ion memory is used as a cell array, a word line and a bit line are arranged above and below the memory cell, for applying an electric potential or an electric current from an external portion so as to carry out a writing, a deleting and a reading. A so-called cross point type memory is considered to be the highest in a degree of integration, the cross point type memory has structures that the bit line and the word line are arranged so as to intersect, and the bit line and the word line are alternately stacked. In the case that the memory cell is used as the cell array, it is necessary to have a rectifying function for the cell array. For this purpose, in addition to a connection in series of a rectifying element to each of the memory cells, there has been also made a study of provision of the rectifying function in the facing electrode.

For the ion memory mentioned above, there is demand that the memory cell has a reliable structure in which a pattern collapse and a pattern strain are hard to be generated in the course of a manufacturing process in connection with a refining of an element.

DETAILED DESCRIPTION

Figure 1:
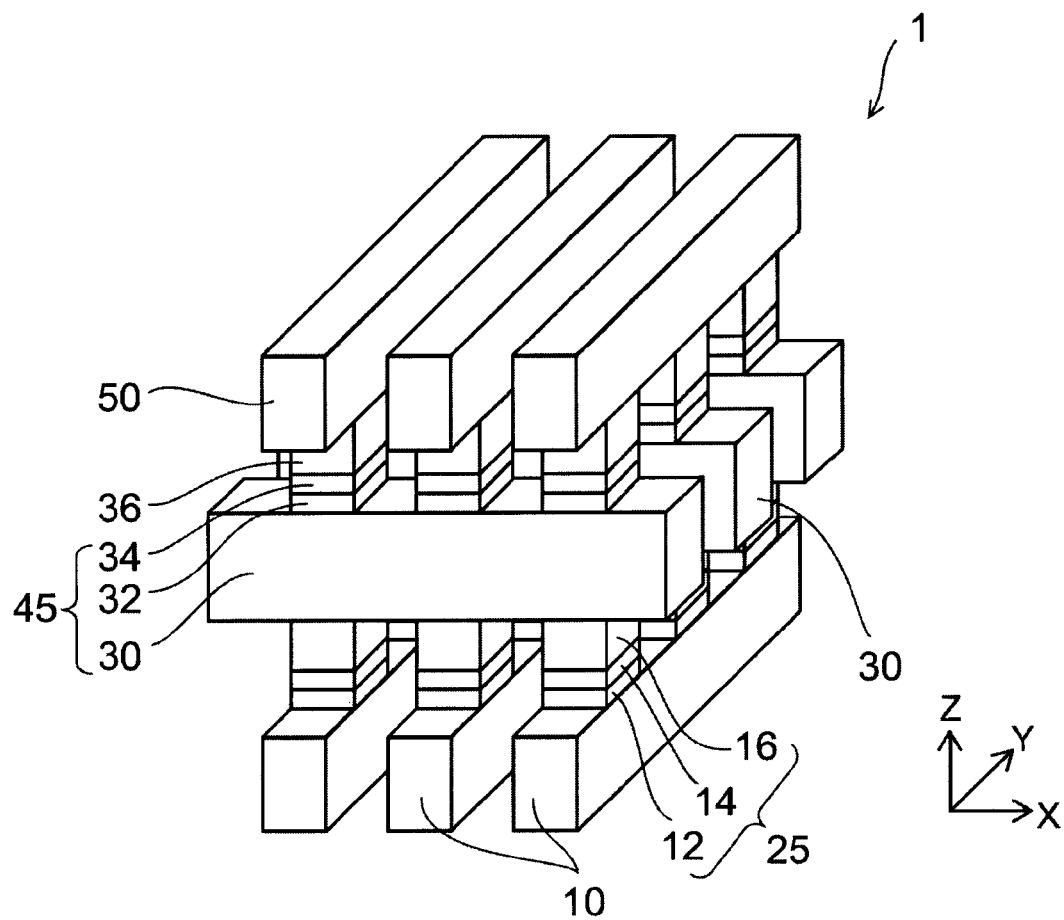
FIG. 1 is a schematically perspective view of a nonvolatile memory device according to a first embodiment.

In general, according to one embodiment, a nonvolatile memory device includes a first wiring layer. The device includes a second wiring layer intersecting with the first wiring layer. And the device includes a first memory layer provided at a position where the first wiring layer and the second wiring layer intersect. And the first memory layer contacts with the first wiring layer, and the first wiring layer is a layer which is capable of supplying a metal ion to the first memory layer.

A description will be given below of an embodiment with reference to the accompanying drawings. In the following description, the same reference numerals are attached to the same members, and a description will be accordingly omitted with regard to the members which have been described once.

(First Embodiment)

FIG. 1 is a schematically perspective view of a nonvolatile memory device according to a first embodiment.

The nonvolatile memory device 1 according to the first embodiment is an ion memory (CBRAM) device which is one of the resistance variable type memories.

The nonvolatile memory device 1 includes a wiring layer 30 (a first wiring layer 30), a wiring layer 50 (a second wiring layer 50) which intersects with the wiring layer 30, and a memory layer 32 (a first memory layer 32) which is provided at a position where the wiring layer 30 and the wiring layer 50 intersect. Further, the nonvolatile memory device 1 includes a wiring layer 10 (a third wiring layer 10) which intersects with the wiring layer 30 and is provided on an opposite side of the wiring layer 50, a memory layer 14 (a second memory layer 14) which is provided at a position where the wiring layer 30 and the wiring layer 10 intersect, and a metal layer 16 which is interposed between the wiring layer 30 and the memory layer 14.

The wiring layer 10, the wiring layer 30 and the wiring layer 50 are stacked in a direction of Z. The wiring layer 30 extends in a direction of X. Each of the wiring layer 50 and the wiring layer 10 extends in a direction of Y which is orthogonal to the direction of X and the direction of Z.

In addition, the nonvolatile memory device 1 includes a facing electrode layer 34 (a first facing electrode layer 34) which is provided between the memory layer 32 and the wiring layer 50, and a metal layer 36. The nonvolatile memory device 1 includes a facing electrode layer 12 (a second facing electrode layer 12) which is provided between the wiring layer 10 and the memory layer 14. Further, a set including the wiring layer 30, the memory layer 32 and the facing electrode layer 34 is referred as a memory cell 45 (a first memory cell 45). Further, a set including the facing electrode layer 12, the memory layer 14 and the metal layer 16 is referred as a memory cell 25 (a second memory cell 25). Further, the nonvolatile memory device 1 includes an interlayer insulating film (which is not illustrated in FIG. 1) between the wiring layers and between the memory cells. The memory layer may be called as a rewritable (RW) layer.

The memory layer 32 comes into contact with the wiring layer 30. The wiring layer 30 comes to be, for example, the bit line, and serves as a metal ion supply layer which can supply a metal ion to the memory layer 32. In this case, the metal ion supply layer is a layer which is made of a metal before the metal ion is ionized, or a layer which includes the metal ion. Further, the metal layer 16 is a metal ion supply layer which can supply the metal ion to the memory layer 14, and serves as a stopper layer at a time of a chemical mechanical polishing (CMP) in a manufacturing process of the nonvolatile memory device 1 (mentioned later). The wiring layer 50 and the wiring layer 10 come to be, for example, the word line.

By the structure mentioned above, it is possible to carry out an operation of writing, deleting and reading the information with respect to the memory cells 24 and 45 above and below the wiring layer 30 by one wiring layer 30. For example, with regard to the writing on the memory cell 45, a positive electric potential is applied to the wiring layer 30 which corresponds to the bit line, and a negative electric potential is applied to the wiring layer 50 which corresponds to the word line. Accordingly, the metal included in the wiring layer 30 is ionized so as to be attracted to the wiring layer 50 side, and the metal ion is introduced into the memory layer 32. Accordingly, an electric resistance of the memory layer 32 is lowered, and the memory layer 32 is going to have a lower conductivity. As a result, an electric current flows between the wiring layer 30 and the wiring layer 50. This action is called as a writing (or a set action).

On the contrary, the negative electric potential is applied to the wiring layer 30 which corresponds to the bit line, and the positive electric potential is applied to the wiring layer 50 which corresponds to the word line. Accordingly, the metal ion introduced into the memory layer 32 is brought back to the wiring layer 30, and is reset to a high resistance value before writing. This action is called as a deleting (or a reset action).

The metal included in the wiring layer 30 and the metal layer 16 is at least one of metals selected from a group of Ag, Cu, Ni, Co and Ti. Further, the metal included in the wiring layer 30 and the metal layer 16 may be constituted by an alloy in which Ag is contained in any one of W, Ta and Mo. The metal ion introduced into the memory layer is at least one of metal ions selected from a group of Ag, Cu, Ni, Co and Ti.

As a material of the memory layer 32 and the memory layer 14, any one of an insulating material such as $SiO_2$, $Si_3N_4$ or the like, a transition metal oxide such as $HfO_2$, $TiO_2$, $WO_2$ or the like, in addition to a-Si (an amorphous silicon) is used. As a material of the facing electrode layers 12 and 34, any one of a doped-Ply-Si, a metal, and a stacked film of them or the like is used. The facing electrode layers 12 and 34 can provide a rectifying property in a combination with the RW layer on the basis of a selection of the materials. The wiring layer 50 and the wiring layer 10 include at least one of metals selected from the group of W, Mo, Al, Ti and Ta. The material of the metal layer 36 is any one of W, Mo or the like.

In this case, the nonvolatile memory device 1 includes a foundation layer (for example, an interlayer insulating film) which is not illustrated below the wiring layer 10, in addition to members shown in FIG. 1, and includes further an integrated circuit for driving each of the memory cells below the foundation layer. Further, the wiring layer 10 and the wiring layer 50 may be the bit line, and the wiring layer 30 may be the word line.

A description will be given of a manufacturing process of the nonvolatile memory device 1 according to the first embodiment.

The manufacturing process of the nonvolatile memory device according to the first embodiment includes a process of dividing a first stacked film which includes a first wiring layer and a first memory layer in a first direction, and forming a plurality of first stacked films which extend in a second direction intersecting with the first direction and include the first wiring layer and the first memory layer, a process of forming a second wiring layer on the plurality of first stacked films, and a process of dividing the second wiring layer in the second direction and forming a plurality of second wiring layers which extend in the first direction. In this case, the first wiring layer is a layer which can supply a metal ion to the first memory layer.

Further, the second wiring layer is divided in the second direction, and the first memory layer is divided in the second direction.

The manufacturing process of the nonvolatile memory device according to the first embodiment further includes a process of dividing a second stacked film which includes a third wiring layer, a second memory layer and a metal layer in the second direction before dividing the first stacked body in the first direction, and forming a plurality of second stacked films which extend in the first direction intersecting with the second direction, and include the third wiring layer, the second memory layer and the metal layer, and a process of forming the first stacked body on the plurality of second stacked films. In this case, the metal layer is a layer which can supply a metal ion to the second memory layer. Further, the first stacked film is divided in the first direction, and the second memory layer and the metal layer are divided in the first direction.

A description will be given below of a specific example of the manufacturing process of the nonvolatile memory device according to the first embodiment.

FIGS. 2A to 6 are schematically perspective views for describing manufacturing process of the nonvolatile memory device according to the first embodiment.

Figure 2A:
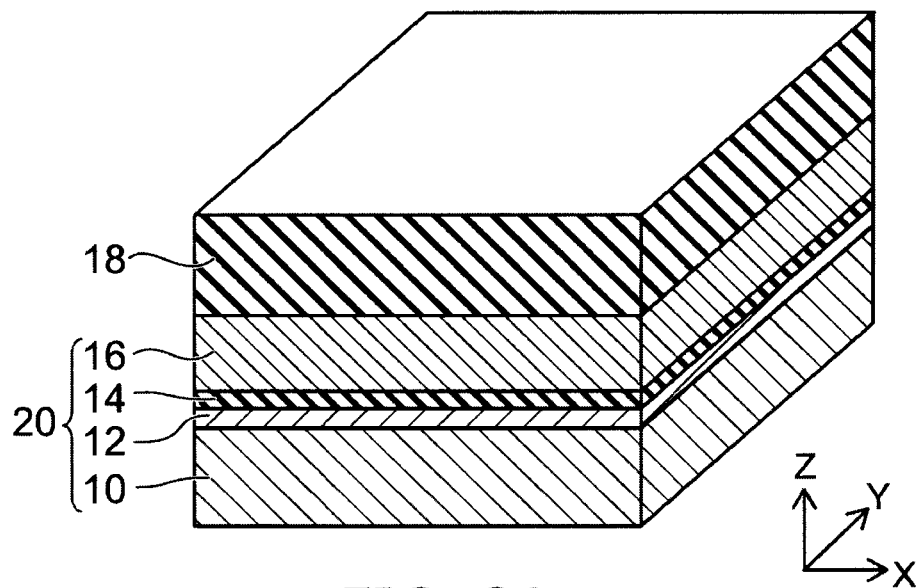
FIGS. 2A to 6 are schematically perspective views for describing manufacturing process of the nonvolatile memory device according to the first embodiment.

First of all, as shown in FIG. 2A, the wiring layer 10 before being processed as the word line is formed on the foundation layer which is not illustrated, and the facing electrode layer 12, the memory layer 14, the metal layer 16 coming to the metal ion supply layer, and an insulating hard mask layer 18 are formed in this order on the wiring layer 10. In other words, a stacked film 20 having the wiring layer 10, the facing electrode layer 12, the memory layer 14 and the metal layer 16 is formed on the foundation layer.

A material of the hard mask layer 18 is, for example, $Si_3N_4$, $SiO_2$ or the like. The metal layer 16 has an electric conductivity and serves as a stopper layer at a time of carrying out a chemical mechanical polishing (CMP) mentioned later.

Figure 2B:
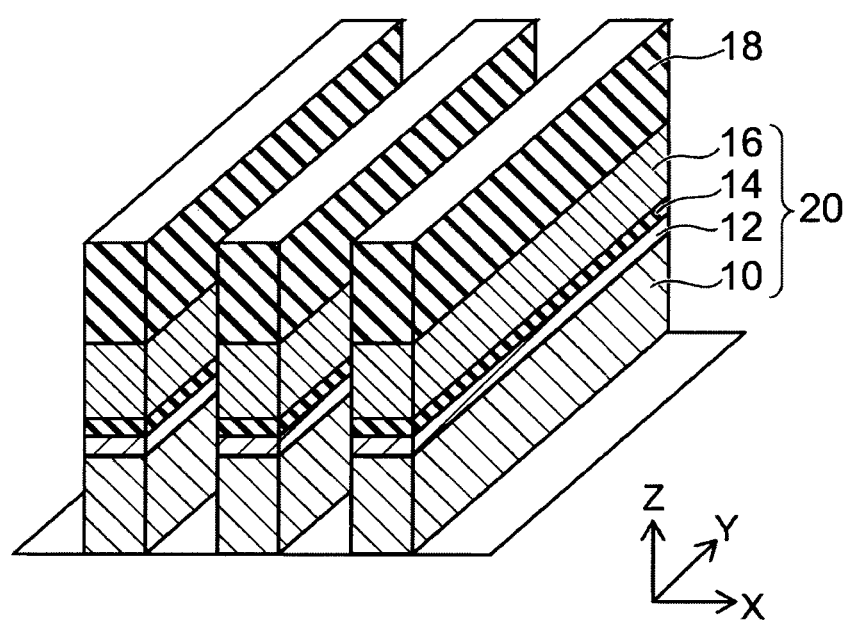

Next, as shown in FIG. 2B, the stacked film 20 is divided into a plurality of sections in the direction of X by a lithography method and a reactive ion etching (RIE) method, and the stacked film 20 is processed so as to come to a line extending in the direction of Y. In this stage, the wiring layer 10 (for example, the word line) extending in the direction of Y is formed.

Figure 3A:
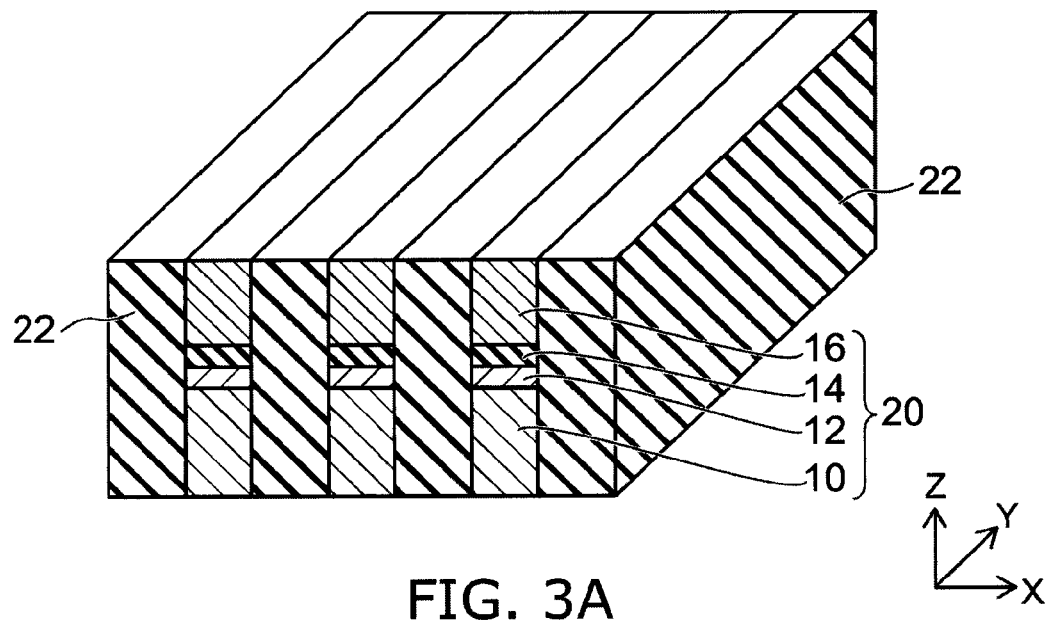

Next, as shown in FIG. 3A, an interlayer insulating film 22 is formed between the adjacent stacked films 20. A material of the interlayer insulating film 22 is $SiO_2$, SiOC or the like. The hard mask layer 18 mentioned above is removed by the CMP with setting a surface of the metal layer 16 as a stop position. Accordingly, a surface of the stacked film 20 is flattened.

Figure 3B:
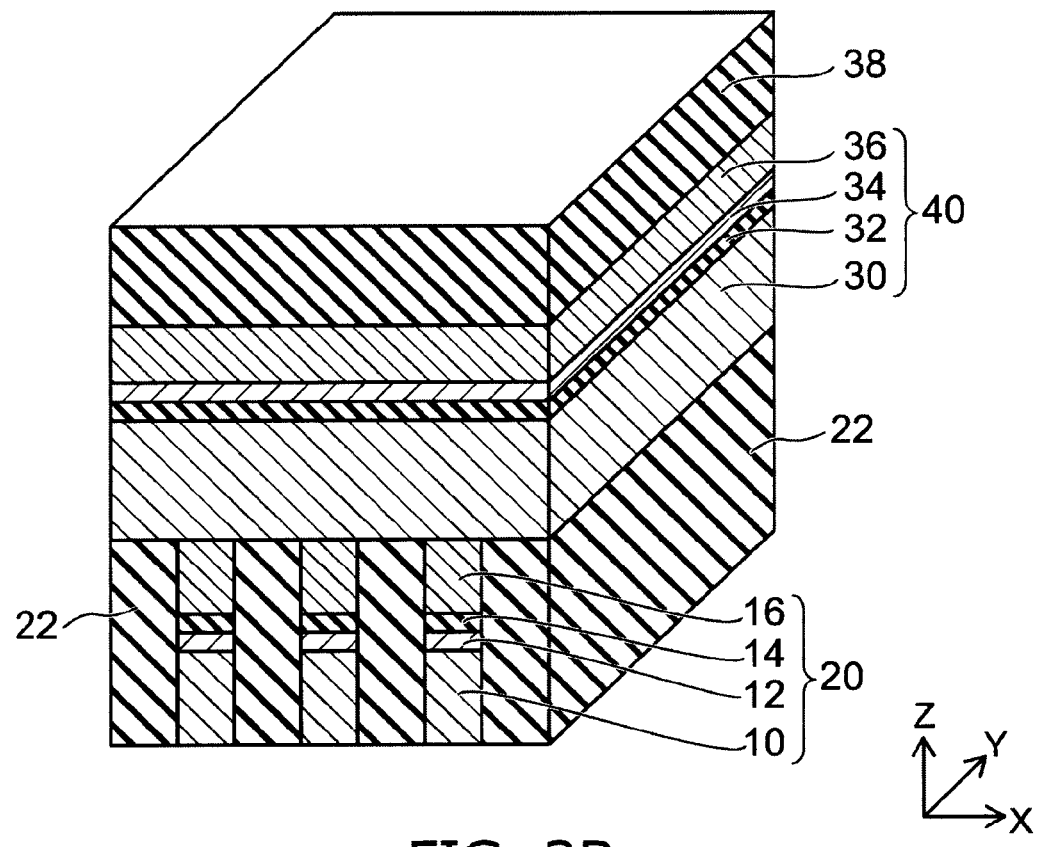

Next, as shown in FIG. 3B, the wiring layer 30 before being processed as the bit line is formed on the stacked film 20 and on the interlayer insulating film 22. In succession, the memory layer 32, the facing electrode layer 34, the metal layer 36, and the insulative hard mask 38 are formed on the wiring layer 30 which also comes to the metal ion supply layer in this order. In other words, the stacked film 40 having the wiring layer 30, the memory layer 32, the facing electrode layer 34 and the metal layer 36 is formed on the stacked film 20 and on the interlayer insulating film 22.

A material of the hard mask layer 38 is, for example, Si₃N₄, SiO₂ or the like. The metal layer 36 has an electric conductivity and serves as a stopper layer at a time of carrying out the CMP mentioned later.

Figure 4A:
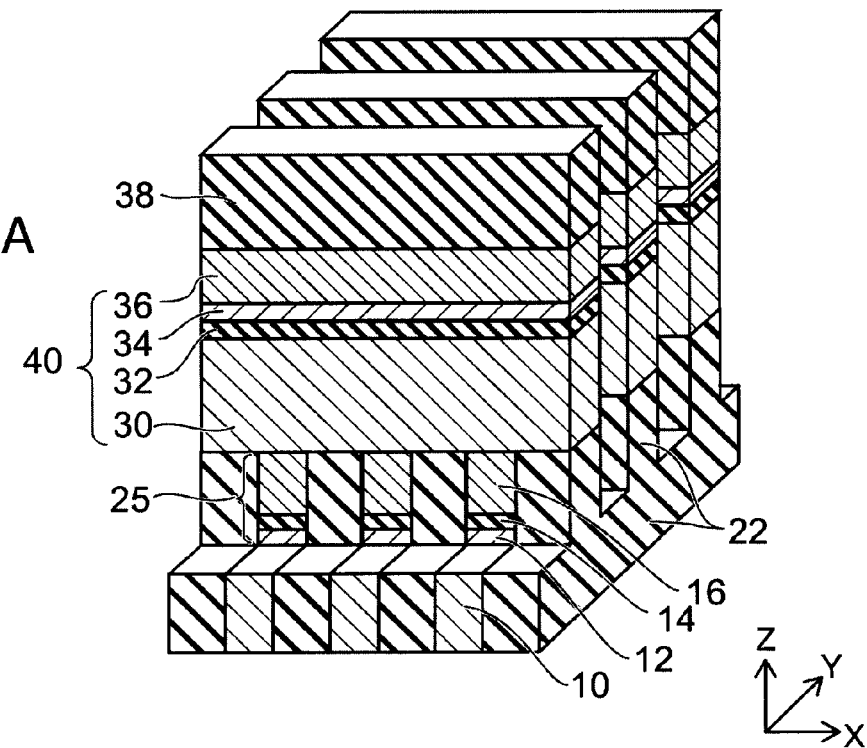

Next, as shown in FIG. 4A, the stacked film 40 is divided into a plurality of sections in the direction of Y by using the lithography method or the RIE method, and is processed such that the stacked film 40 comes to a line extending in the direction of X. Further, the stacked film 20 positioned below the stacked film 40 is divided in the direction of Y. However, in this stage, the wiring layer 10 is not processed by the RIE. In other words, the metal layer 36, the facing electrode layer 34, the memory layer 32, the wiring layer 30 which also comes to the metal ion supply layer, the metal layer 16, the memory layer 14 and the facing electrode layer 12 are etched. Further, the interlayer insulating film 22 is also processed by the RIE.

In this stage, since the facing electrode layer 12, the memory layer 14 and the metal layer 16 are divided in the direction of X and the direction of Y, the rectangular parallelepiped memory cell 25 is formed. Further, the wiring layer 30 (for example, the bit line) extending in the direction of X is formed.

Figure 4B:
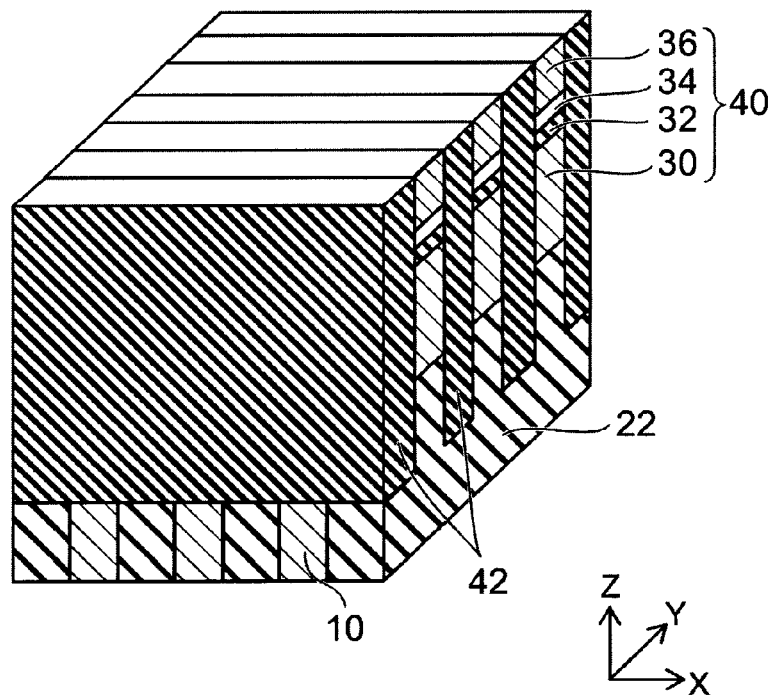

Next, as shown in FIG. 4B, the interlayer insulating film 42 is formed between the adjacent stacked films 40 and between the memory cells 25. A material of the interlayer insulating film 42 is SiO₂, SiOC or the like. The hard mask layer 38 mentioned above is removed by the CMP with setting the surface of the metal layer 16 as a stop position. Accordingly, the surface of the stacked film 40 is flattened.

Figure 5A:
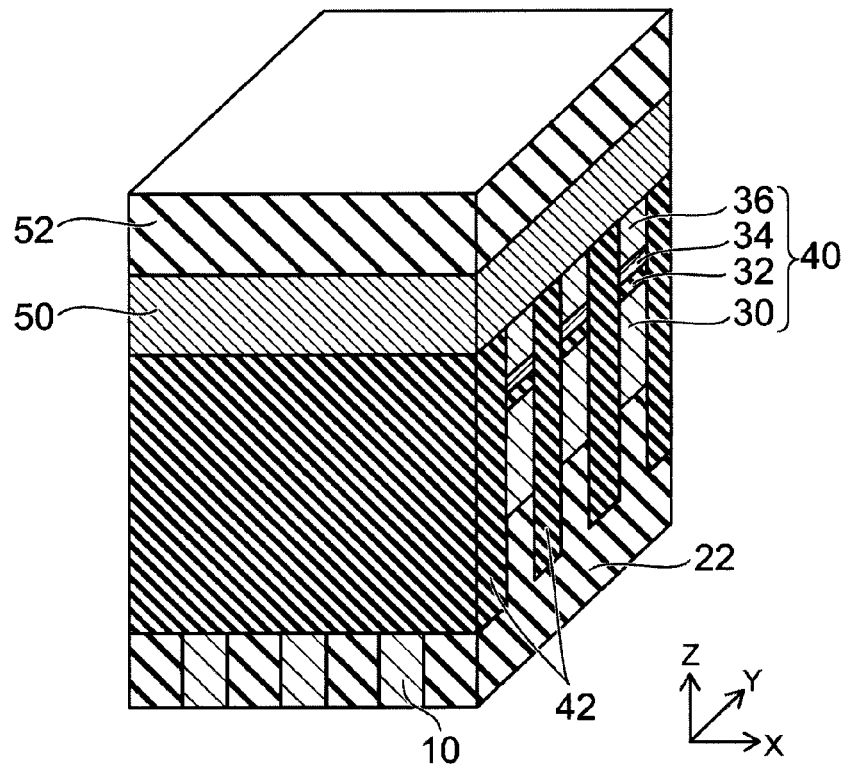

Next, as shown in FIG. 5A, the wiring layer 50 before being processed as the word line is formed on the stacked film 40 and on the interlayer insulating film 42, and the hard mask layer 52 is formed on the wiring layer 50.

Figure 5B:
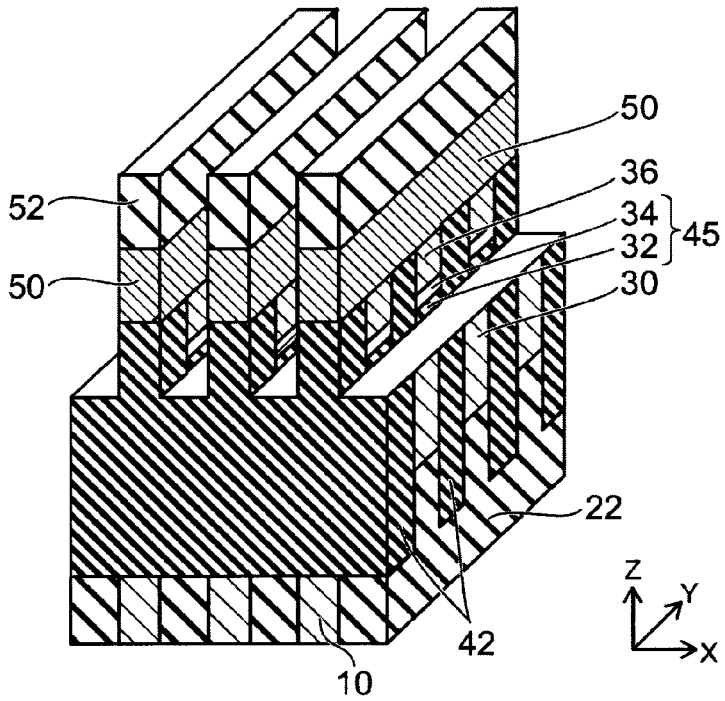

Next, as also shown in FIG. 5B, the wiring layer 50, the metal layer 36, the facing electrode layer 34 and the memory layer 32 are further divided in the direction of X by using the lithography method and the RIE method. Further, the interlayer insulating film 42 is processed by RIE.

In this stage, since the facing electrode layer 34 and the memory layer 32 are divided in the direction of X and the direction of Y, the memory cell 45 is formed. Further, the wiring layer (for example, the word line) extending in the direction of Y is formed.

Figure 6:
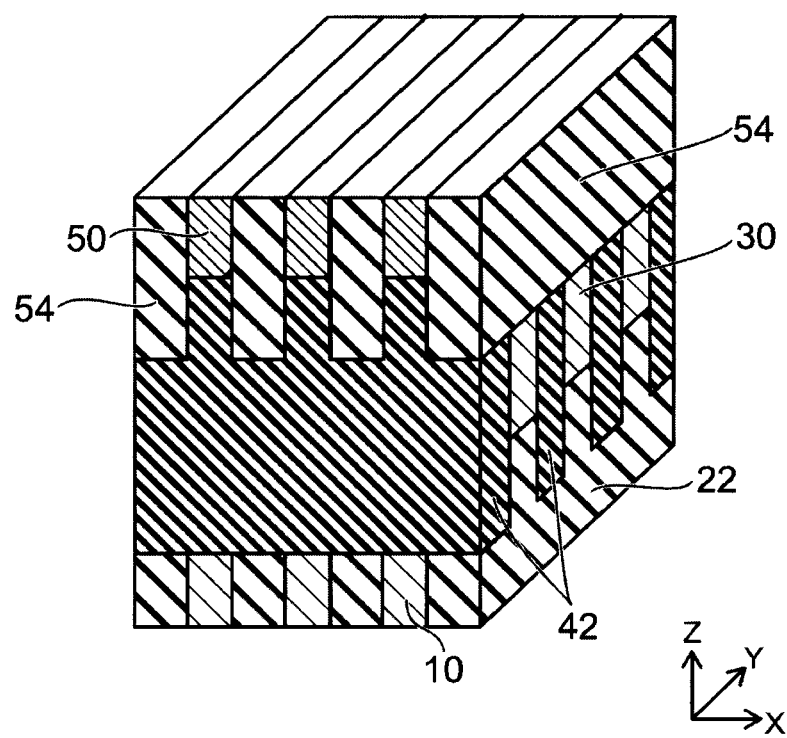

Next, as shown in FIG. 6, the interlayer insulating film 54 is applied between the adjacent wiring layers 50. Further, in succession, the hard mask layer 52 mentioned above is removed by the CMP with setting the surface of the metal layer 36 as a stop position.

In accordance with the manufacturing process mentioned above, a cross point type nonvolatile memory device 1 having two mats and three wirings is formed.

A description will be given of a manufacturing process of a nonvolatile memory device in accordance with a first reference example.

FIGS. 7A to 11B are schematically perspective views for describing manufacturing process of the nonvolatile memory device in accordance with the first reference example.

Figure 7A:
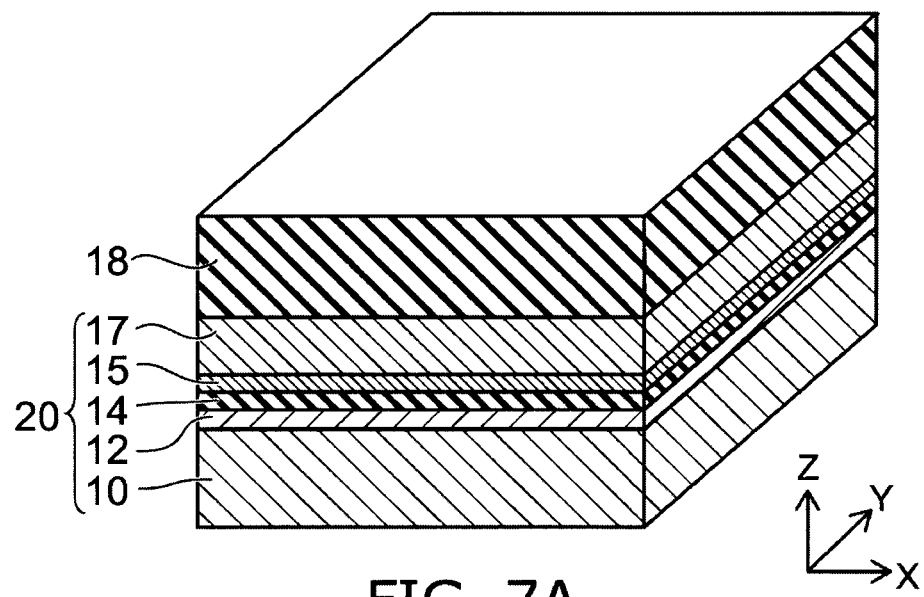
FIGS. 7A to 11B are schematically perspective views for describing manufacturing process of a nonvolatile memory device in accordance with the first reference example.

First of all, as shown in FIG. 7A, the wiring layer 10 is formed on a foundation layer which is not illustrated, the facing electrode layer 12, the memory layer 14, the metal ion supply layer 15, the metal layer 17 and the insulative hard mask layer 18 are formed in this order on the wiring layer 10. In other words, the stacked film 20 having the wiring layer 10, the facing electrode layer 12, the memory layer 14, the metal ion supply layer 15 and the metal layer 17 is formed on the foundation layer. The metal ion supply layer 15 includes at least one of metals selected from a group of Ag, Cu, Ni, Co and Ti. The metal layer 17 has an electric conductivity, and serves as a stopper layer at a time of carrying out the CMP. A material of the metal layer 17 is any one of W, Mo or the like.

Figure 7B:
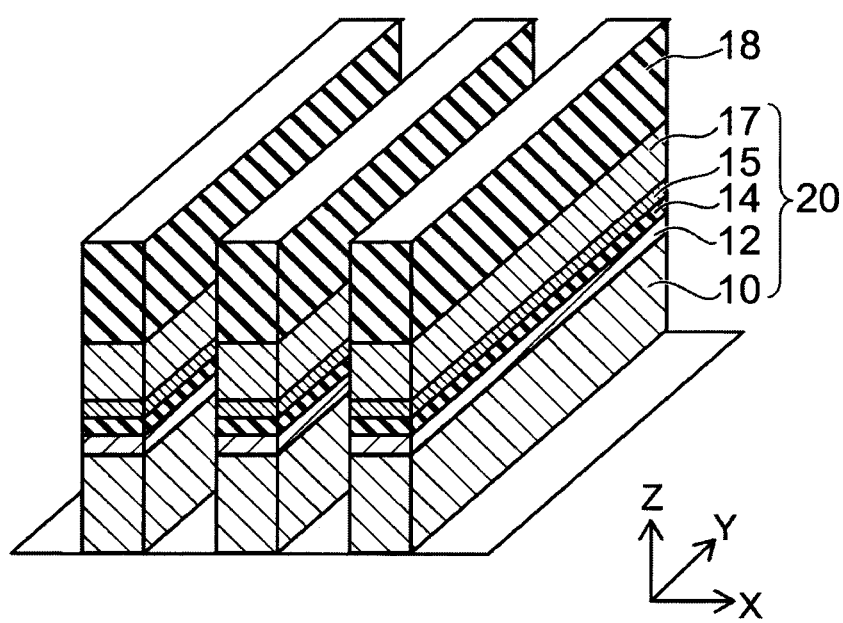

Next, as shown in FIG. 7B, the stacked film 20 is divided into a plurality of sections in the direction of X in accordance with the lithography method and the RIE method, and is processed such that the stacked film 20 comes to a line which extends in the direction of Y. In this stage, the wiring layer 10 (the word line) extending in the direction of Y is formed.

Figure 8A:
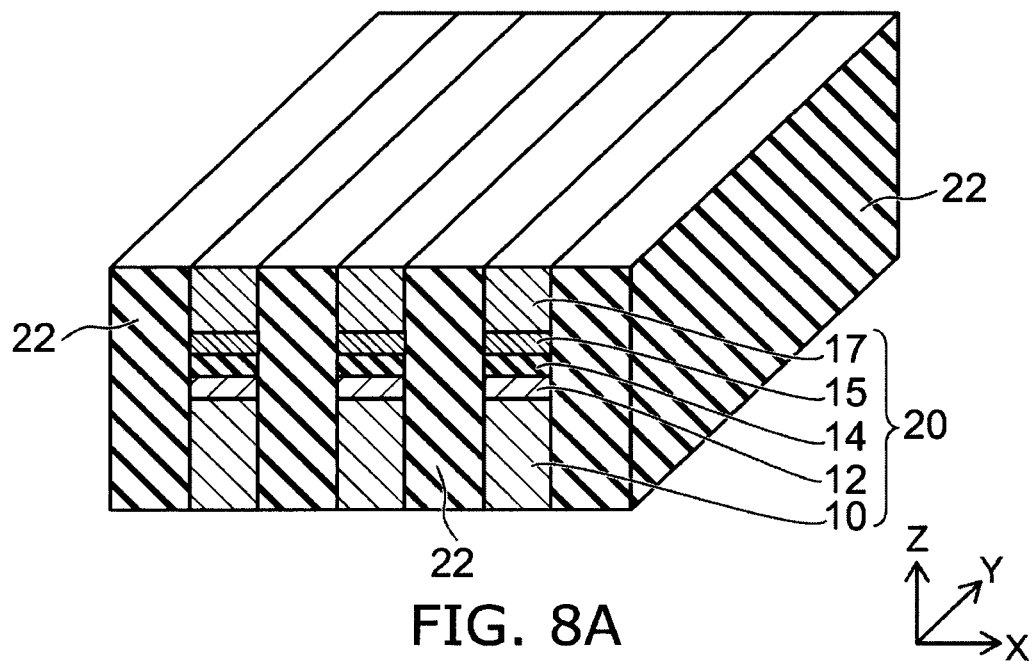

Next, as shown in FIG. 8A, the interlayer insulating film 22 is formed between the adjacent stacked films 20. The hard mask layer 18 mentioned above is removed by the CMP with setting the surface of the metal layer 16 as a stop position.

Figure 8B:
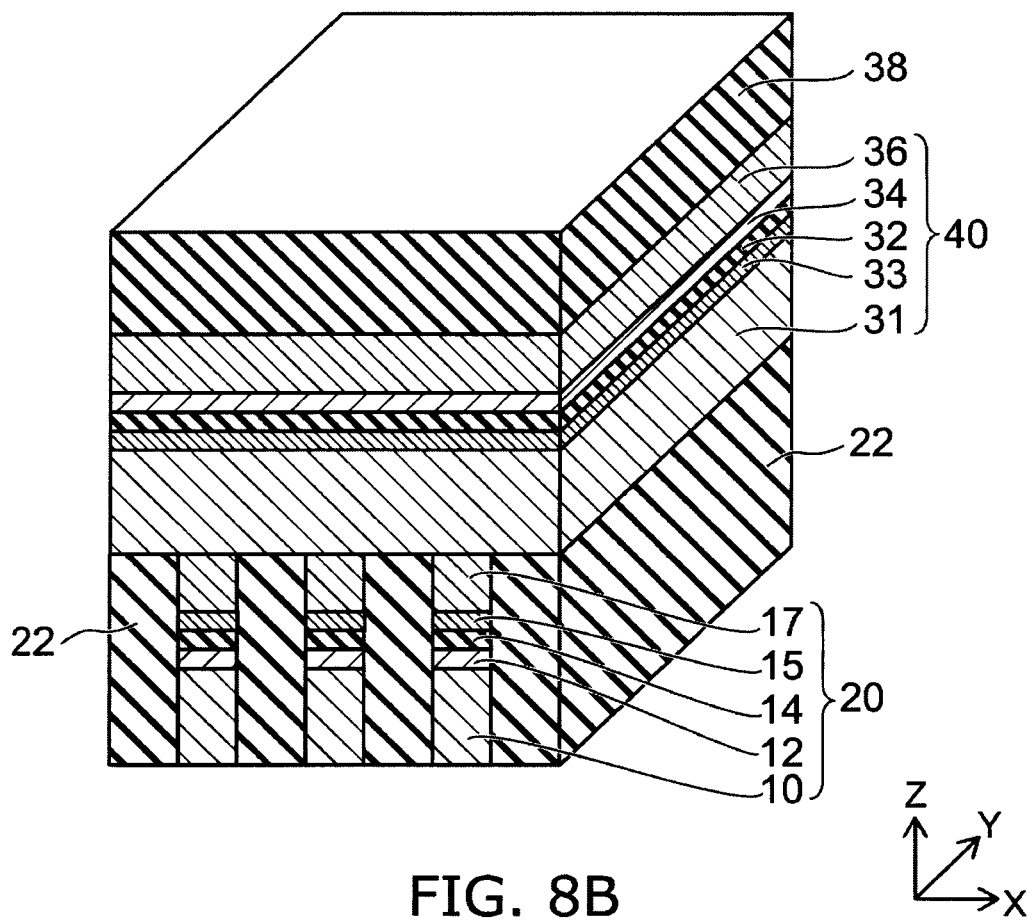

Next, as shown in FIG. 8B, the wiring layer 31 before being processed as the bit line is formed on the stacked film 20 and on the interlayer insulating film 22. A material of the wiring layer 31 is any one of W, Mo or the like. In succession, the metal ion supply layer 33, the memory layer 32, the facing electrode layer 34, the metal layer 36 and the insulative hard mask layer 38 are formed in this order on the wiring layer 31. In other words, the stacked film 40 having the wiring layer 31, the metal ion supply layer 33, the memory layer 32, the facing electrode layer 34 and the metal layer 36 is formed on the stacked film 20 and on the interlayer insulating film 22. The metal ion layer 33 includes at least one of metals selected from a group of Ag, Cu, Ni, Co and Ti.

Figure 9A:
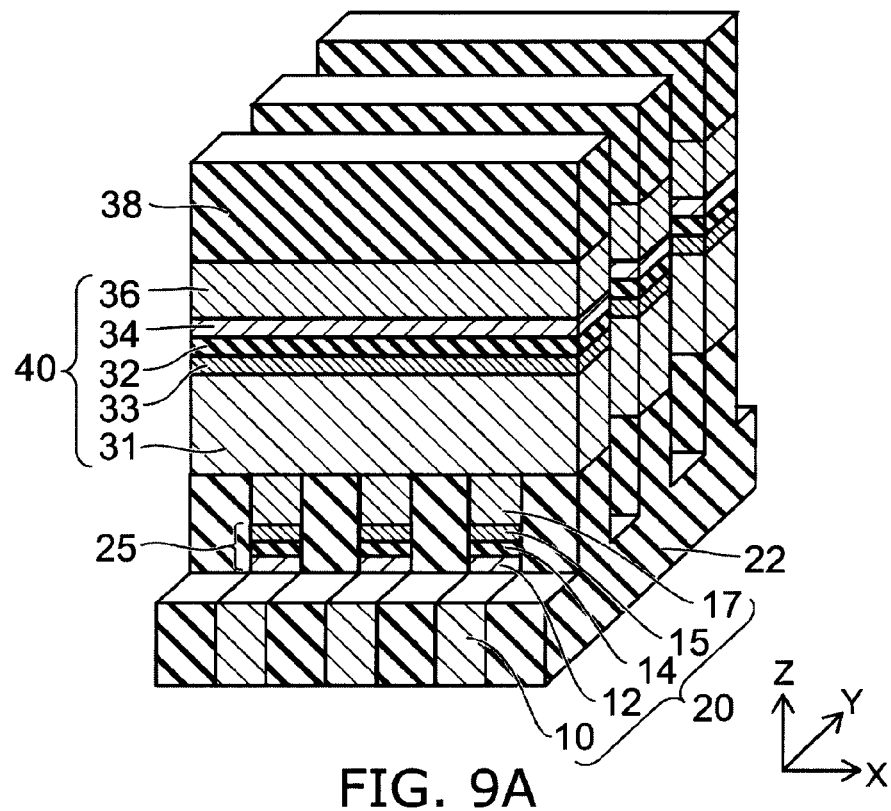

Next, as shown in FIG. 9A, the stacked film 40 is divided into a plurality of sections in the direction of Y by using the lithography method and the RIE method, and is processed such that the stacked film 40 comes to a line which extends in the direction of X. Further, the stacked film 20 positioned below the stacked film 40 is divided in the direction of Y. However, in this stage, the wiring layer 10 is not processed by the RIE. In other words, the metal layer 36, the facing electrode layer 34, the memory layer 32, the metal ion supply layer 33, the wiring layer 31, the metal layer 17, the metal ion supply layer 15, the memory layer 14 and the facing electrode layer 12 are etched. Further, the interlayer insulating film 22 is processed by the RIE.

In this stage, since the facing electrode layer 12, the memory layer 14, the metal ion supply layer 15 and the metal layer 17 are divided in the direction of X and the direction of Y, the rectangular parallelepiped memory cell 25 is formed. Further, the wiring layer 31 (the bit line) which extends in the direction of X is formed.

Figure 9B:
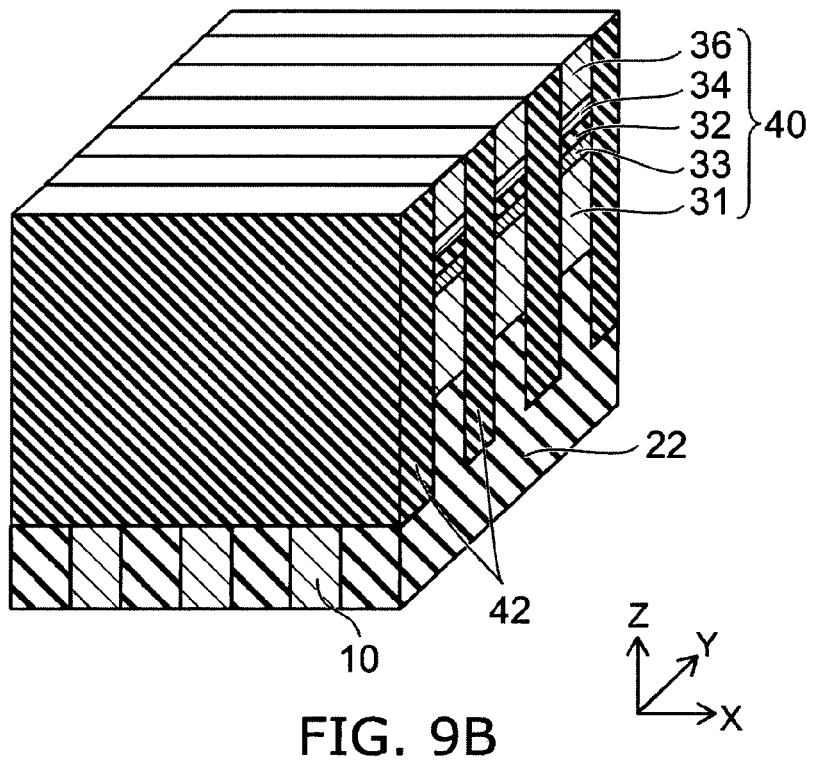

Next, as shown in FIG. 9B, the interlayer insulating film 42 is formed between the adjacent stacked films 40 and between the memory cells 25. The hard mask layer 38 mentioned above is removed by the CMP with setting the surface of the metal layer 16 as a stop position.

Figure 10A:
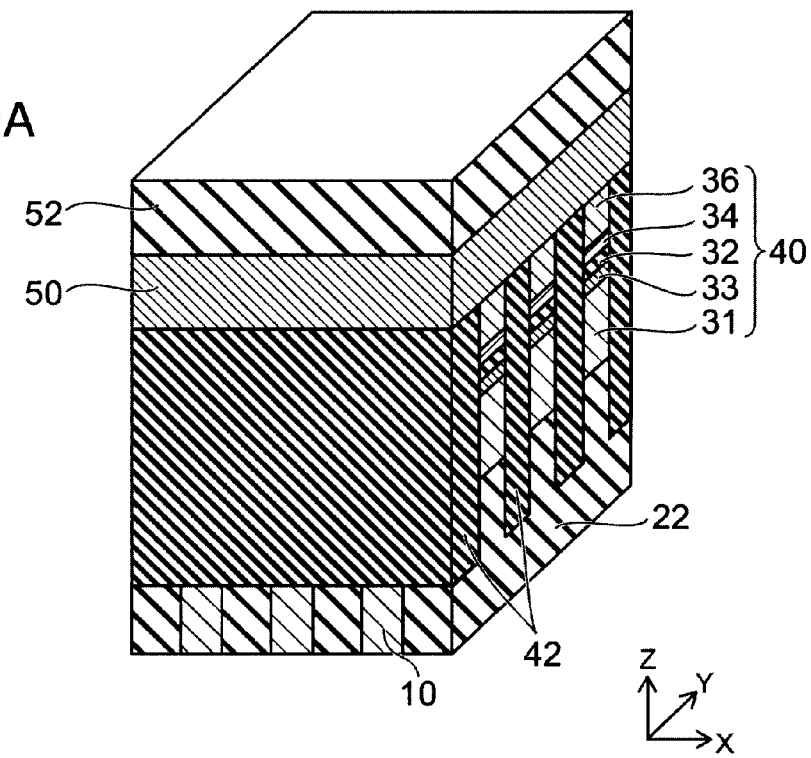

Next, as shown in FIG. 10A, the wiring layer 50 before being processed as the word line is formed on the stacked film 40 and the interlayer insulating film 42, and the hard mask layer 52 is formed on the wiring layer 50.

Figure 10B:
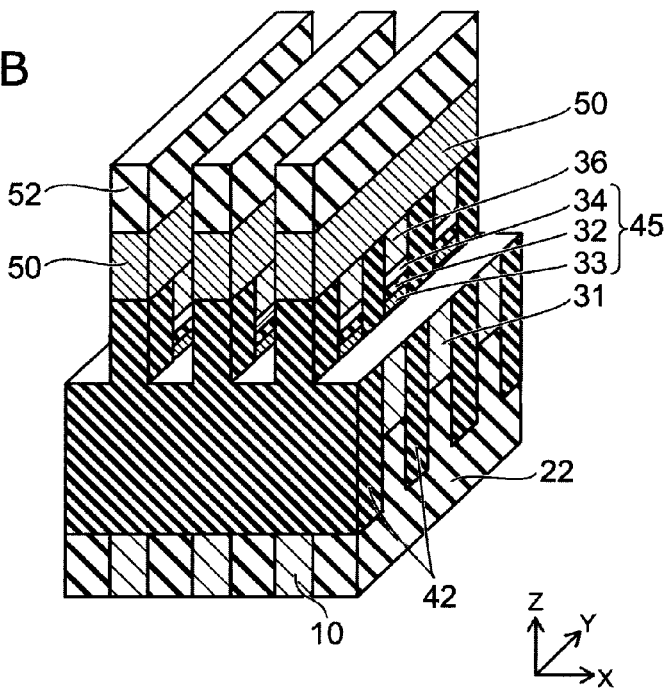

Next, as shown in FIG. 10B, the wiring layer 50, the metal layer 36, the facing electrode layer 34, the memory layer 32, and the metal ion supply layer 33 are further divided in the direction of X by using the lithography method and the RIE method. Further, the interlayer insulating film 42 is processed by the RIE.

In this stage, since the facing electrode layer 34, the memory layer 32 and the metal ion supply layer 33 are divided in the direction of X and the direction of Y, the memory cell 45 is formed. Further, the wiring layer 50 (the word line) which extends in the direction of Y is formed.

Figure 11A:
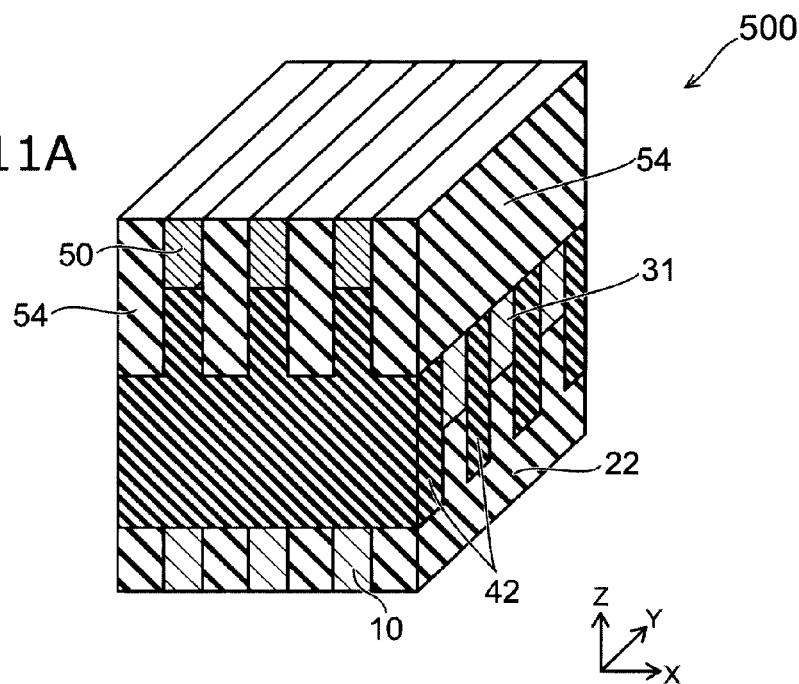

Next, as shown in FIG. 11A, the interlayer insulating film 54 is applied between the adjacent wiring layers 50. Further, in succession, the hard mask layer 52 mentioned above is removed by the CMP with setting the surface of the metal layer 36 as a stop position.

Figure 11B:
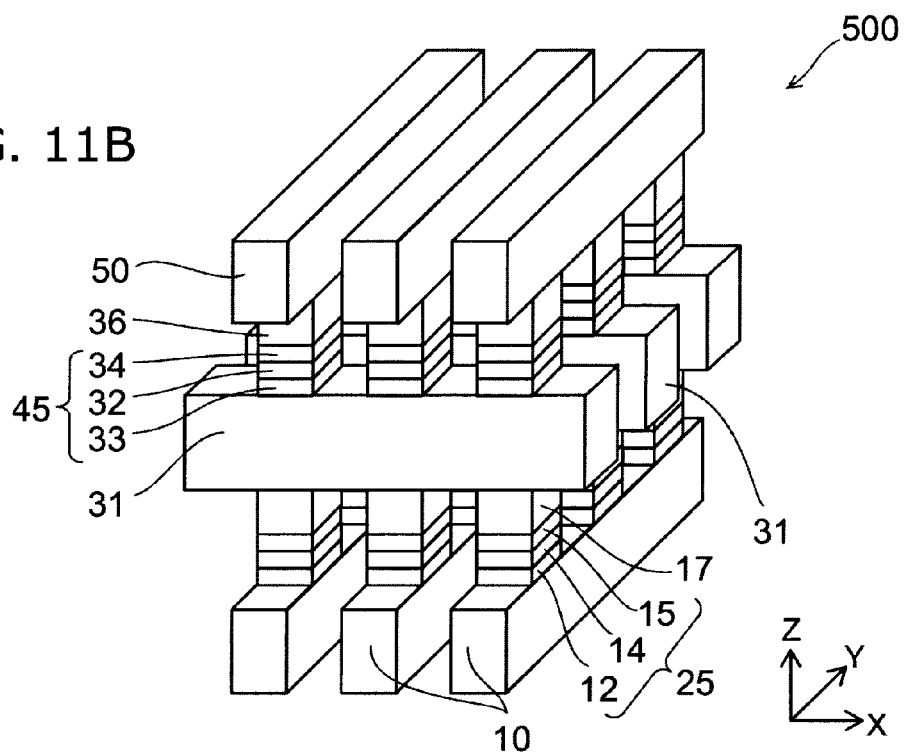

In accordance with the manufacturing process mentioned above, the cross point type nonvolatile memory device 500 having two mats and three wirings is formed. In FIG. 11B, a state of the nonvolatile memory device 500 in the case that the interlayer insulating film is removed is shown.

In the reference example, each of the memory cells 25, 45 is processed as a rectangular parallelepiped shape by the RIE method. In the reference example, each of the metal ion supply layers 15, 33 is additionally provided, in comparison with the first embodiment. Accordingly, in the reference example, it is necessary to increase a thickness of the hard mask layer 38 because a film thickness of the metal ion supply layer 15 and a film thickness of the metal ion supply layer 33 are added (refer to FIG. 9A).

For example, in the RIE process illustrated in FIG. 9A, in the case that the material of the hard mask layer 38 and the material of the interlayer insulating film 22 are both $SiO_2$, the hard mask layer 38 is also etched at a time when the interlayer insulating film 22 is etched. This is because the material of the hard mask layer 38 is identical to the material of the interlayer insulating film 22. Accordingly, in the reference example, the thickness of the hard mask layer 38 is made as large as possible because it is difficult to select RIE process which obtains a high selection ratio (a ratio of etching speed between the hard mask layer and the other position than the hard mask layer).

However, if the thickness of the hard mask layer 38 is increased, there is a problem that the pattern is broken during the manufacturing process or the pattern is deformed due to a stress of the hard mask layer 38, in conjunction with the refining of the element. This comes to an obstacle to the refining of the element.

On the contrary, in the nonvolatile memory device 1 according to the first embodiment, the wiring layer 31 according to the reference example is set to the wiring layer 30 which is the metal ion supply source. In other words, in the nonvolatile memory device 1, the metal ion supply layer and the bit line are used in common in the wiring layer 30.

Further, in the nonvolatile memory device 1 according to the first embodiment, the formation of the metal ion supply layers 15, 33 according to the reference example is omitted, and the metal layer 17 (the stopper layer for CMP) according to the reference example is set to the metal layer 16 which is the metal ion supply source.

In other words, in the first embodiment, not only it is possible to omit the process of forming the metal ion supply layers 15, 33, but also the film thickness of the process subject of the RIE process is reduced. Accordingly, it is possible to make the thickness of the hard mask layer thinner at this amount. As a result, in the first embodiment, the obstructing to the refining mentioned above is lowered. Accordingly, it is possible to form the nonvolatile memory device in which the reliability is high even if the refining is progressed. Further, the thickness of the memory cell is made thinner because it is unnecessary to form the metal ion supply layers 15, 33, and it is possible to make the nonvolatile memory device thin and compact. Further, since the thickness of the memory cell becomes smaller, a mechanical strength of the memory cell is increased.

(Second Embodiment)

Figure 12:
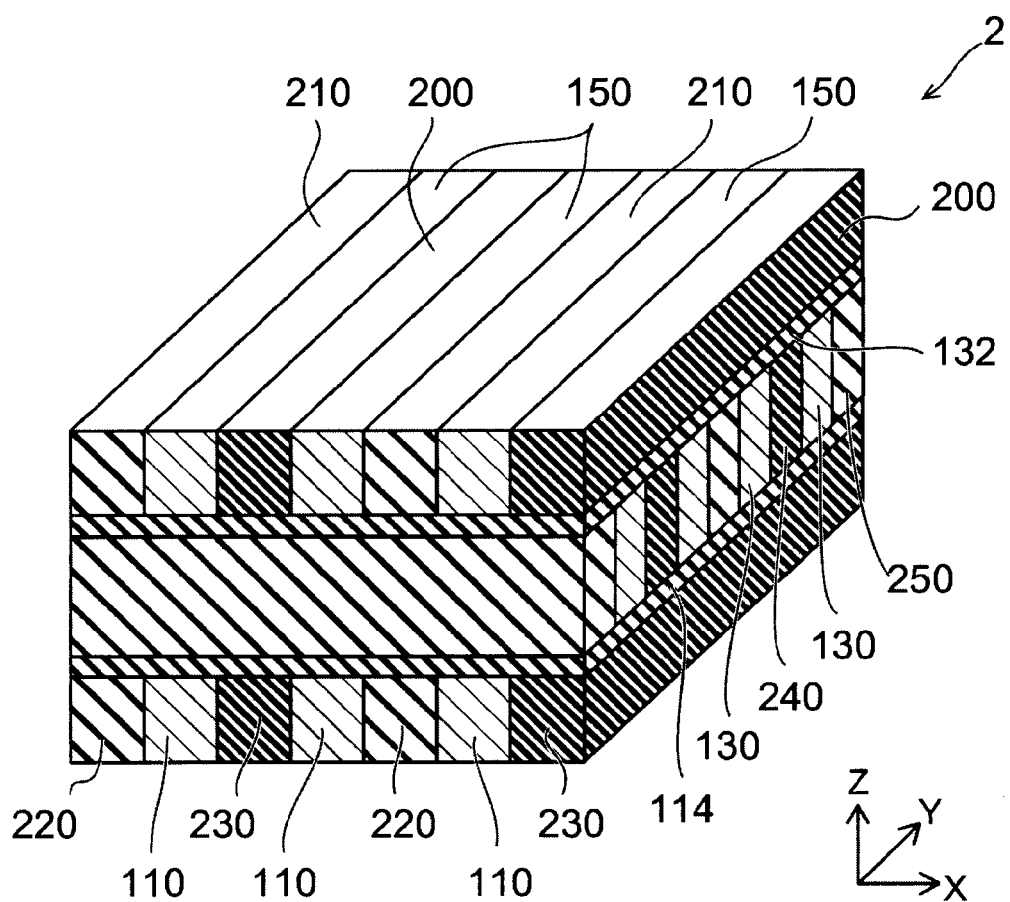
FIG. 12 is a schematically perspective view of a nonvolatile memory device according to a second embodiment.

FIG. 12 is a schematically perspective view of a nonvolatile memory device according to a second embodiment.

A nonvolatile memory device 2 according to the second embodiment is an ion memory device which is one of the resistance variable memories.

The nonvolatile memory device 2 includes a wiring layer 130, a wiring layer 150 which intersects with the wiring layer 130, and a memory layer 132 which is provided at a position where the wiring layer 130 and the wiring layer 150 intersect. Further, the nonvolatile memory device 2 includes a wiring layer 110 which intersect with the wiring layer 130 and is provided on an opposite side of the wiring layer 150, and a memory layer 114 which is provided at a position where the wiring layer 130 and the wiring layer 110 intersect.

The wiring layer 110, the wiring layer 130 and the wiring layer 150 are stacked in the direction of Z. The wiring layer 130 extends in the direction of X. Each of the wiring layer 150 and the wiring layer 110 extends in the direction of Y which is orthogonal to the direction of X and the direction of Z.

In addition, the nonvolatile memory device 2 includes a core member 200 which is provided between the adjacent wiring layers 150, and an interlayer insulating film 210 which is provided between the adjacent wiring layers 150. In other words, the wiring layer 150 is provided between the core member 200 and the interlayer insulating film 210.

Further, the nonvolatile memory device 2 includes a core member 230 which is provided between the adjacent wiring layers 110, and an interlayer insulating film 220 which is provided between the adjacent wiring layers 110. In other words, the wiring layer 110 is provided between the core member 230 and the interlayer insulating film 220.

Further, the nonvolatile memory device 2 includes a core member 240 which is provided between the adjacent wiring layers 130, and an interlayer insulating film 250 which is provided between the adjacent wiring layers 130. In other words, the wiring layer 130 is provided between the core member 240 and the interlayer insulating film 250.

The material of the wiring layer 130 is the same as the wiring layer 30. The wiring layer 130 is, for example, the metal ion supply layer, and the bit line. The wiring layer 130 is a layer which can supply the metal ion to the memory layer 114 in addition to the memory layer 132. The wiring layer 150 and the wiring layer 110 are, for example, the word line. Each of the memory layers 114 and 132 comes into contact with the wiring layer 130.

As a material of the memory layer 132 and the memory layer 114, any one of an insulating material such as $SiO_2$, $Si_3N_4$ or the like, or a transition metal oxide such as $HfO_2$, $TiO_2$, $WO_2$ or the like, in addition to a-Si (amorphous silicon) is used. The wiring layer 150 and the wiring layer 110 include at least one of metals selected from a group of W, Mo, Al, Ti and Ta. The material of the core members 200, 230 and 240 is any one of $SiO_2$, $Si_3N_4$, SiOC or the like. The material of the interlayer insulating films 210, 220 and 250 is any one of $SiO_2$, SiOC or the like.

In this case, the nonvolatile memory device 2 includes a foundation layer (for example, an interlayer insulating film) which is not illustrated below the wiring layer 110, in addition to members shown in FIG. 12, and includes further an integrated circuit for driving each of the memory cells below the foundation layer. Further, the wiring layer 110 and the wiring layer 150 may be the bit line, and the wiring layer 130 may be the word line.

In accordance with the structure mentioned above, it is possible to carry out an operation for writing, deleting and reading the information with respect to the memory layers 132 and 114 above and below the wiring layer 130 by one wiring layer 130.

A description will be given of a manufacturing process of the nonvolatile memory device 2 according to the second embodiment.

The manufacturing process of the nonvolatile memory device according to the second embodiment includes a process of forming a plurality of first wiring layers which are divided in a first direction and extend in a second direction intersecting with the first direction, a process of forming the first memory layer on the plurality of first wiring layers, and a process of forming a plurality of second wiring layers which is divided in the second direction and extend in the first direction, on the first memory layer. In this case, each of the plurality of first wiring layers is a layer which can supply a metal ion to the first memory layer.

Further, before forming the first memory layer, each of the plurality of first wiring layers is provided between a first interlayer insulating film and a first core member. Further, each of the plurality of second wiring layers is provided between a second interlayer insulating film and a second core member.

Further, the manufacturing process of the nonvolatile memory device according to the second embodiment further includes a process of forming a plurality of third wiring layers which are divided in the second direction and extend in the first direction before forming the plurality of first wiring layers, a process of forming a second memory layer on the plurality of third wiring layers, and a process of forming the plurality of first wiring layers on the second memory layer. In this case, each of the plurality of third wiring layers is a layer which can supply the metal ion to the second memory layer.

Further, before forming the second memory layer, each of the plurality of third wiring layers is provided between a third interlayer insulating film and a third core member.

A description will be given below of a specific example of the manufacturing process of the nonvolatile memory device according to the second embodiment.

FIGS. 13A to 17B are schematically perspective views for describing manufacturing process of the nonvolatile memory device according to the second embodiment.

Figure 13A:
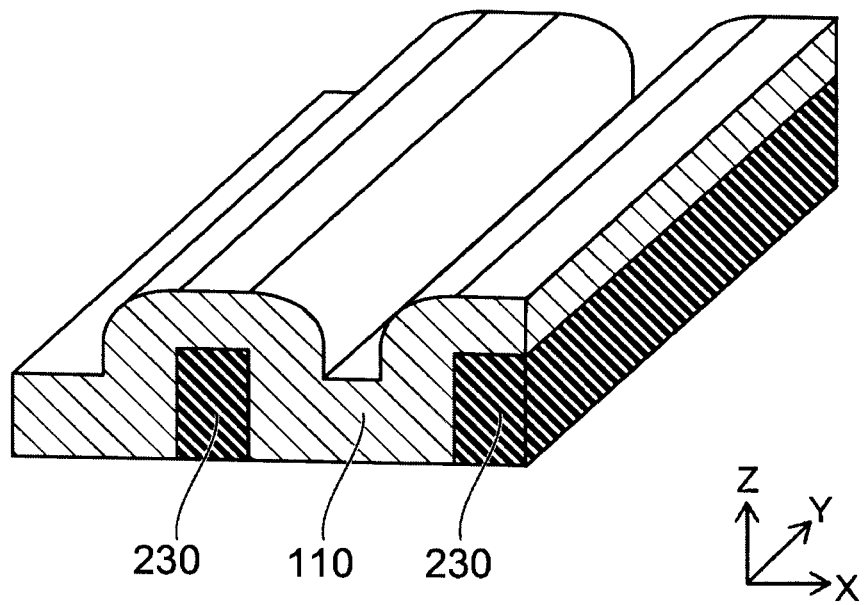
FIGS. 13A to 17B are schematically perspective views for describing manufacturing process of the nonvolatile memory device according to the second embodiment.

First of all, as shown in FIG. 13A, the core member 230 which is divided in the direction of X and extends in the direction of Y is formed by the lithography method and the RIE method. In succession, the core member 230 is covered with the wiring layer 110 in such a manner that the film thickness of the wiring layer 110 becomes uniform anyplace.

Figure 13B:
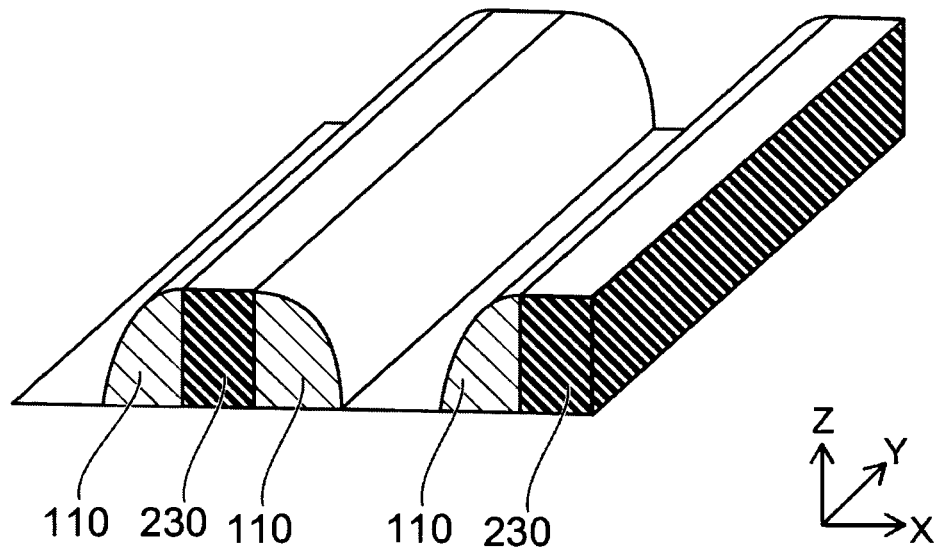

Next, as shown in FIG. 13B, the wiring layer 110 is processed by the RIE method in such a manner that the wiring layer 110 covers a side wall of the core member 230.

Figure 14A:
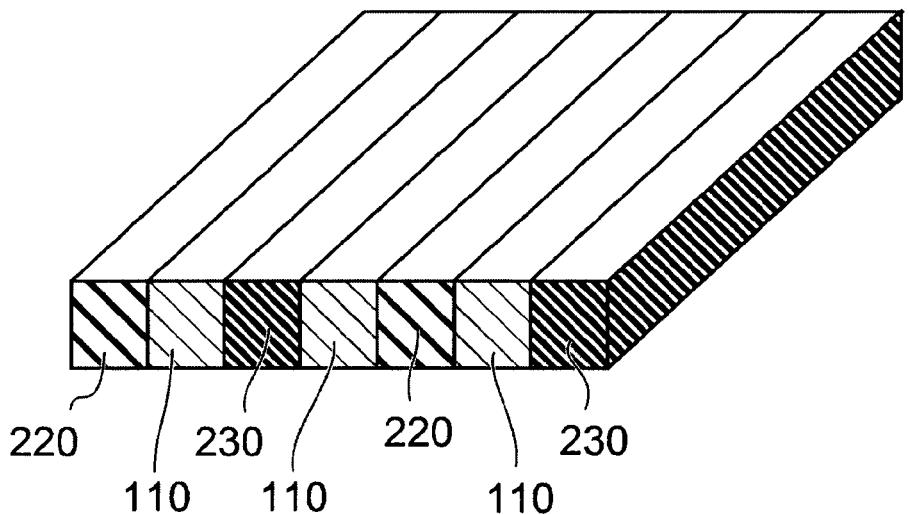

Next, as shown in FIG. 14A, the interlayer insulating film 220 is formed between the adjacent wiring layers 110. Further, the surfaces of the wiring layer 110, the interlayer insulating film 220 and the core member 230 are flattened by the CMP. In this stage, the wiring layer 110 extending in the direction of Y is formed.

Figure 14B:
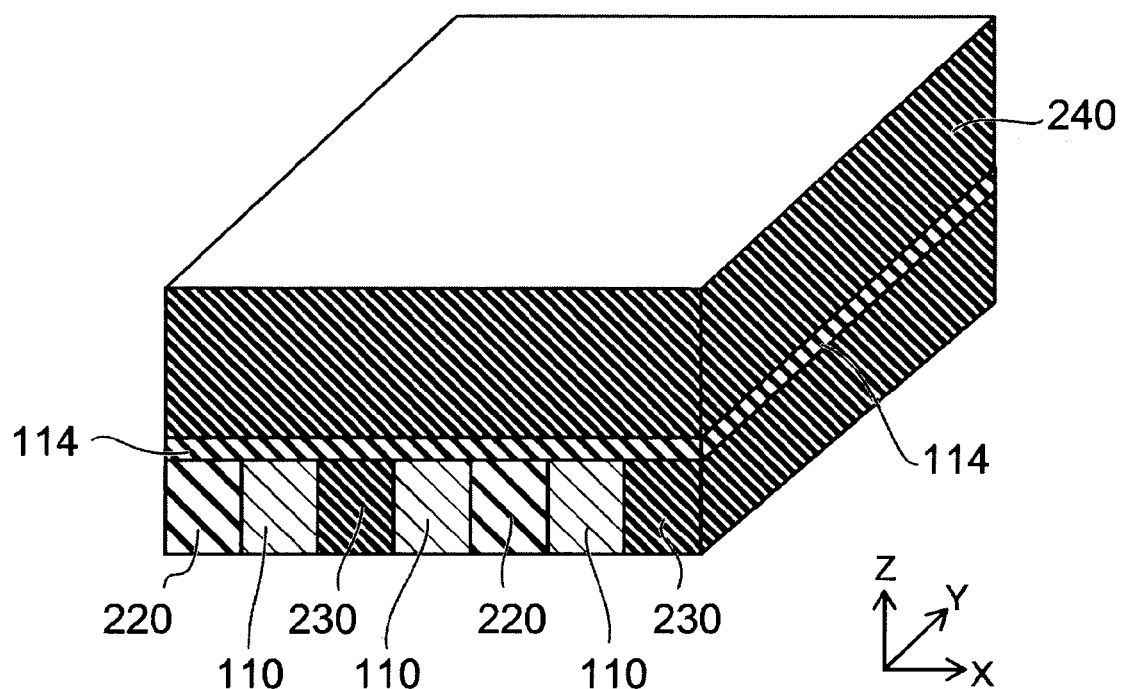

Next, as shown in FIG. 14B, the memory layer 114 is formed on the wiring layer 110, on the interlayer insulating film 220 and on the core member 230. Before forming the memory layer 114, each of a plurality of wiring layers 110 is provided between the interlayer insulating film 220 and the core member 230. In succession, the core member 240 is formed on the memory layer 114.

Figure 15A:
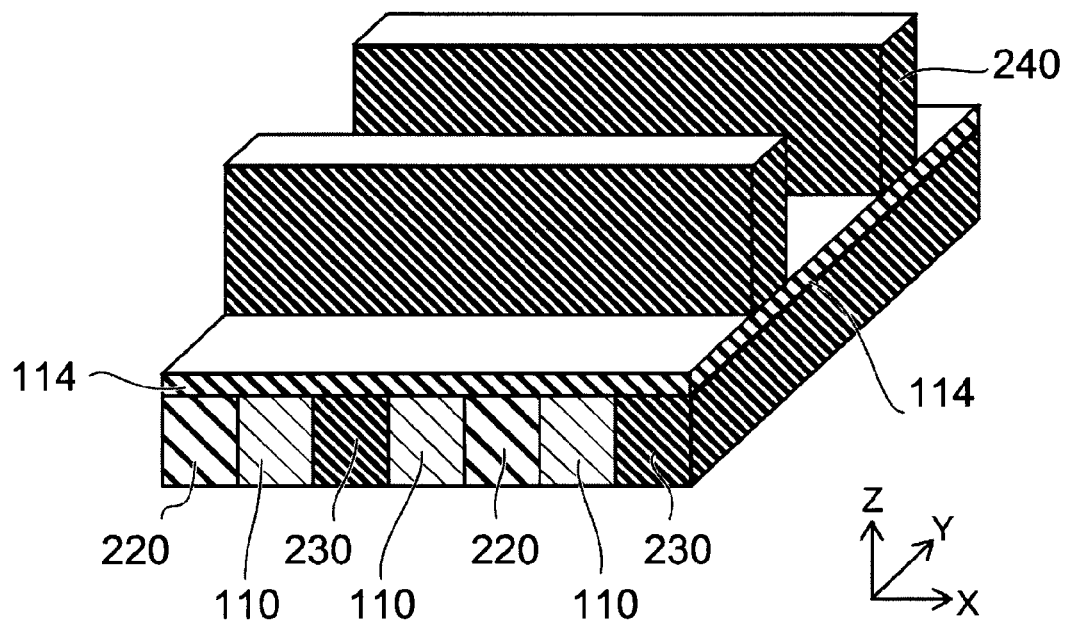

Next, as shown in FIG. 15A, the core member 240 is divided in the direction of Y by the lithograph method and the RIE method, and the core member 240 extending in the direction of X is formed. In this stage, the core member 240 intersecting with the wiring layer 110 is formed.

Figure 15B:
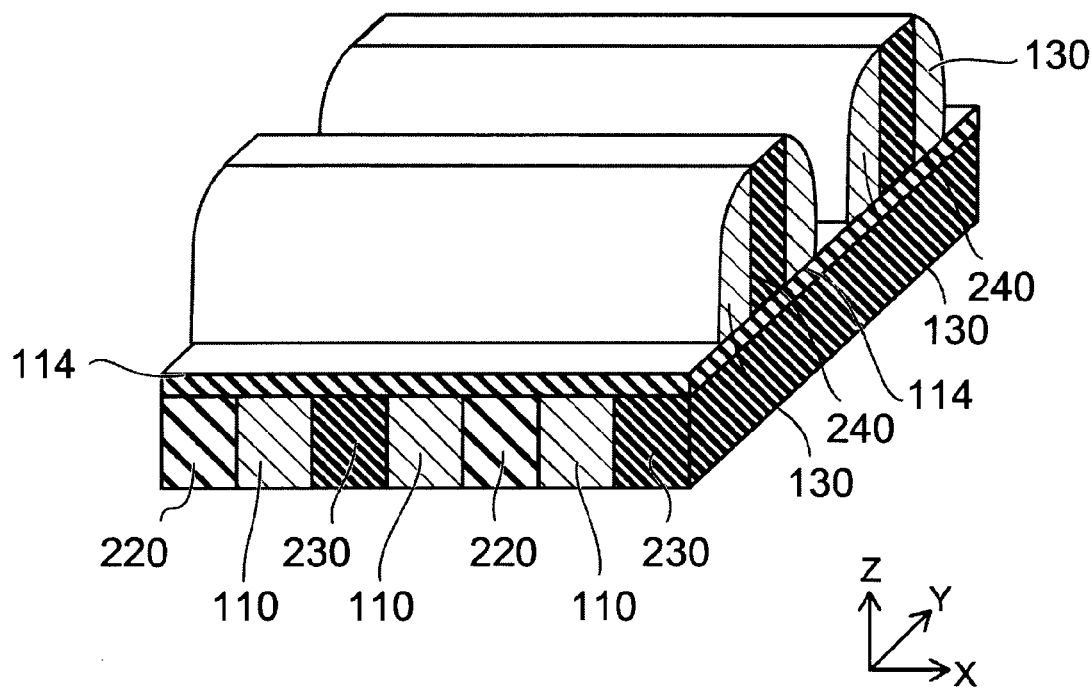

Next, as shown in FIG. 15B, after covering the core member 240 with the wiring layer 130 which also serves as the metal ion supply layer in such a manner that the film thickness of the wiring layer 130 becomes uniform anyplace, the wiring layer 130 is processed by the RIE method in such a manner that the wiring layer 130 covers a side wall of the core member 240.

Figure 16A:
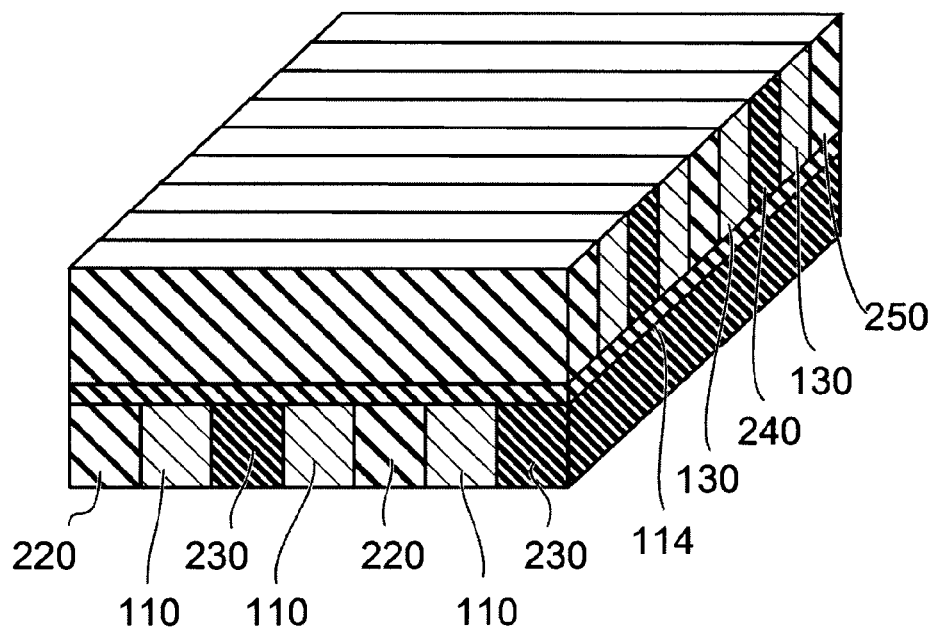

Next, as shown in FIG. 16A, the interlayer insulating film 250 is formed between the adjacent wiring layers 130. Further, the surfaces of the wiring layer 130, the core member 240 and the interlayer insulating film 250 are flattened by the CMP. In this stage, the wiring layer 130 extending in the direction of X is formed.

Figure 16B:
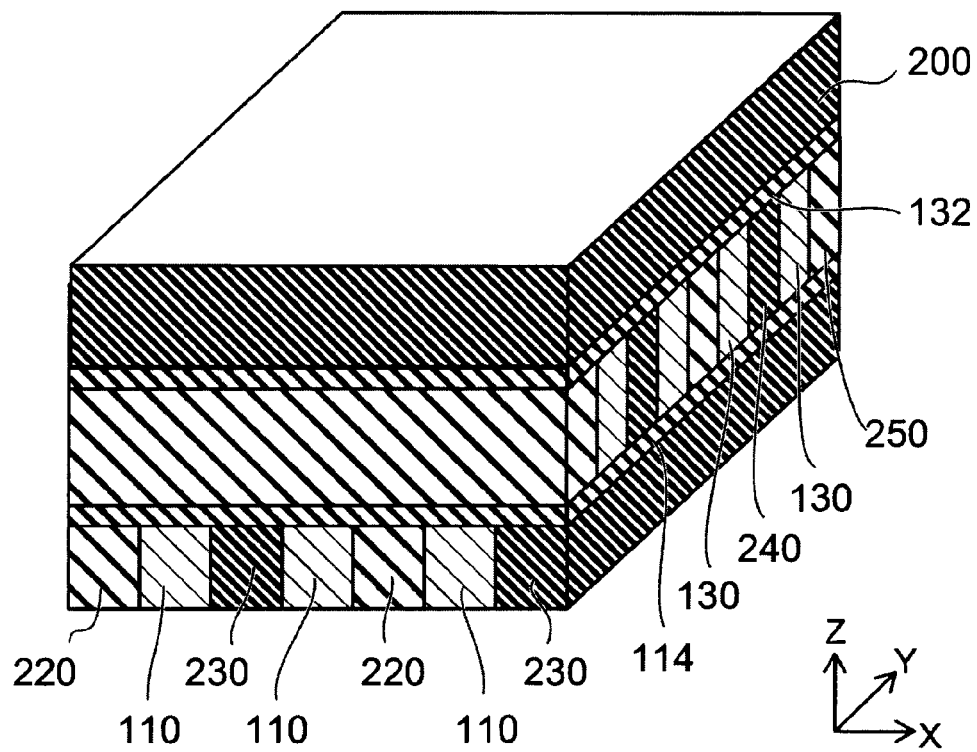

Next, as shown in FIG. 16B, the memory layer 132 is formed on the wiring layer 130, on the core member 240 and on the interlayer insulating film 250. Before forming the memory layer 132, each of a plurality of wiring layers 130 is provided between the interlayer insulating film 250 and the core member 240. Further, the core member 200 is formed on the memory layer 132.

Figure 17A:
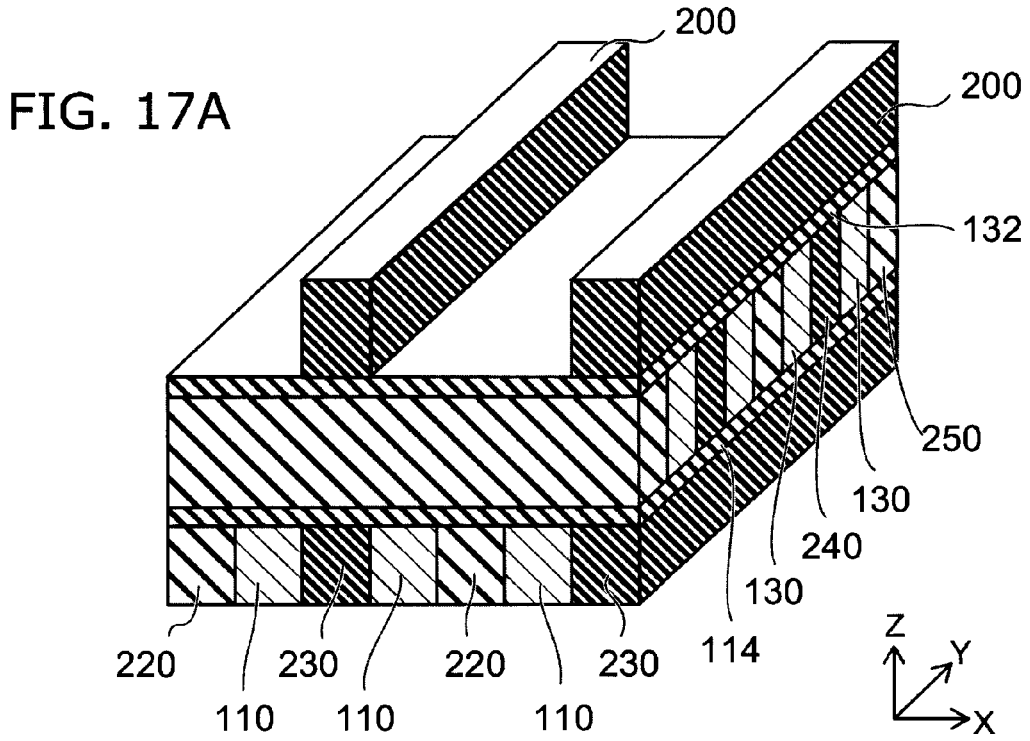

Next, as shown in FIG. 17A, the core member 200 is processed by the lithography method and the RIE method in such a manner as to intersect with the wiring layer 130.

Figure 17B:
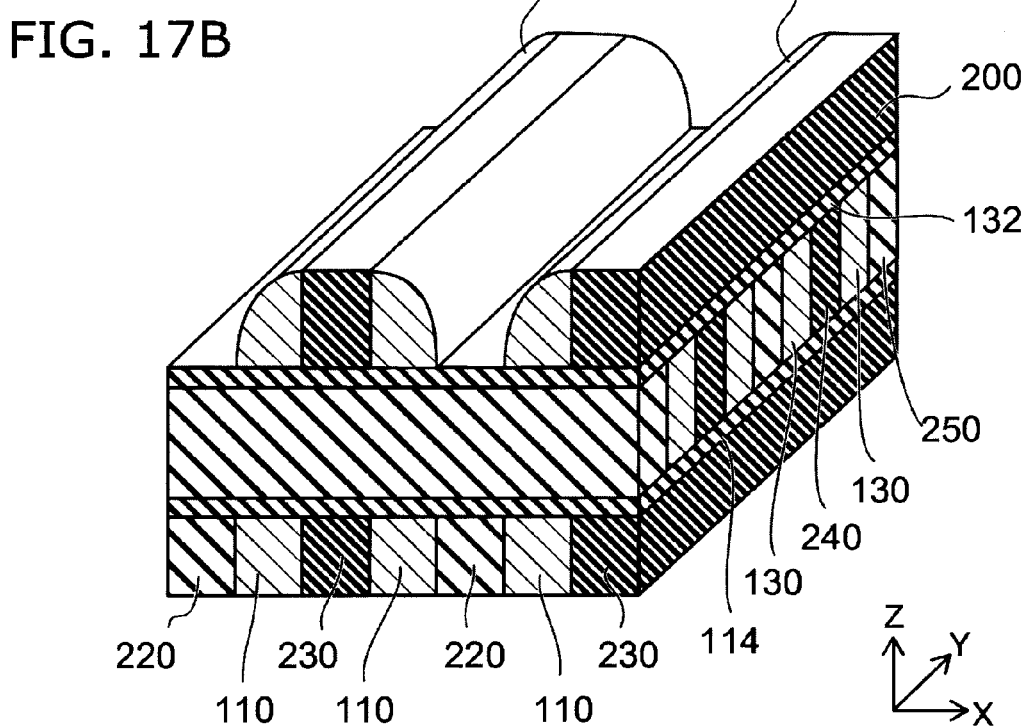

Next, as shown in FIG. 17B, after covering the core member 200 with the wiring layer 150 in such a manner that the film thickness of the wiring layer 150 becomes uniform anyplace, the wiring layer 150 is processed by the RIE method in such a manner that the wiring layer 150 covers a side wall of the core member 200.

Thereafter, the interlayer insulating film 210 is formed between the adjacent wiring layers 150, and the surfaces of the interlayer insulating film 210, the core member 200 and the wiring layer 150 are flattened by the CMP. Each of a plurality of wiring layers 150 is provided between the interlayer insulating film 210 and the core member 200 (refer to FIG. 12).

In accordance with the manufacturing process mentioned above, the cross point type nonvolatile memory device 2 having two mats and three wirings is formed.

A description will be given of a manufacturing process of a nonvolatile memory device according to a second reference example.

FIGS. 18A to 22 are schematically perspective views for describing manufacturing process of the nonvolatile memory device according to the second reference example.

Figure 18A:
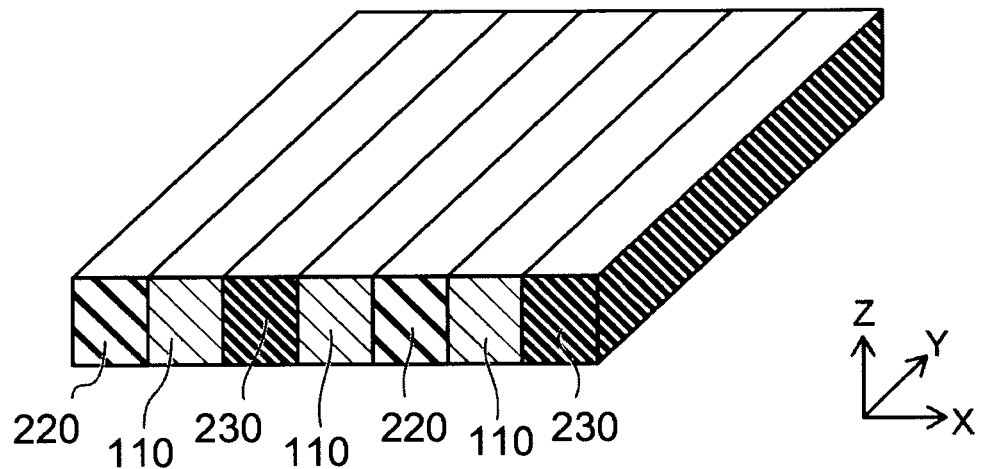
FIGS. 18A to 22 are schematically perspective views for describing manufacturing process of a nonvolatile memory device according to a second reference example.

First of all, as shown in FIG. 18A, the same state of FIG. 14A is prepared. That is, the state in which the wiring layer 110, the interlayer insulating film 220 and the core member 230 extend in the direction of Y is prepared.

Figure 18B:
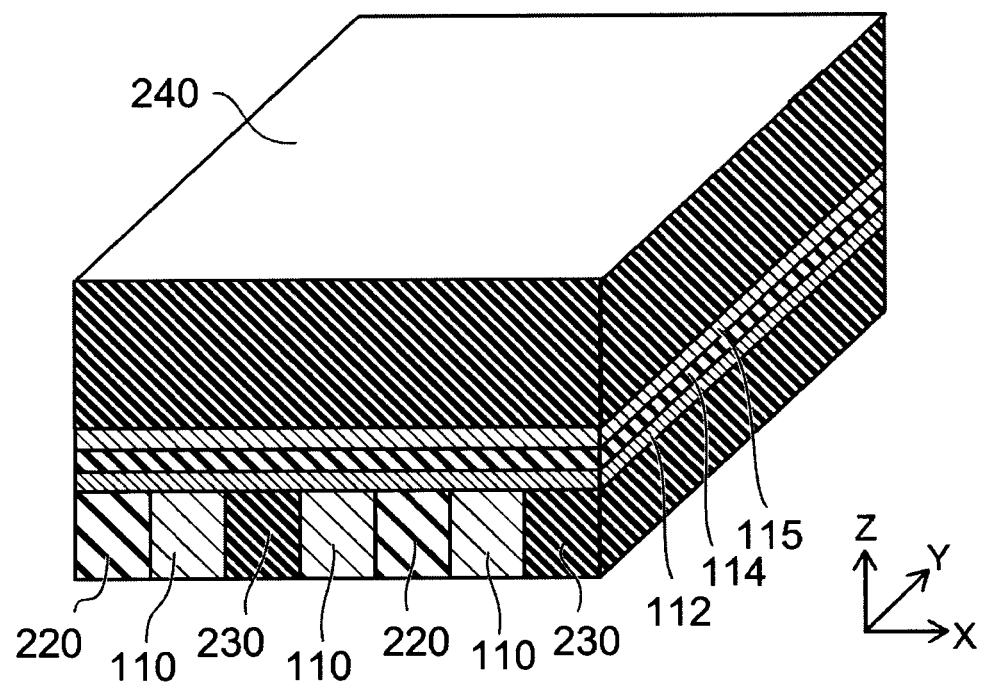

Next, as shown in FIG. 18B, the facing electrode layer 112, the memory layer 114 and the metal ion supply layer 115 are formed on the wiring layer 110, on the interlayer insulating film 220 and on the core member 230. In succession, the core member 240 is formed on the metal ion supply layer 115.

Figure 19A:
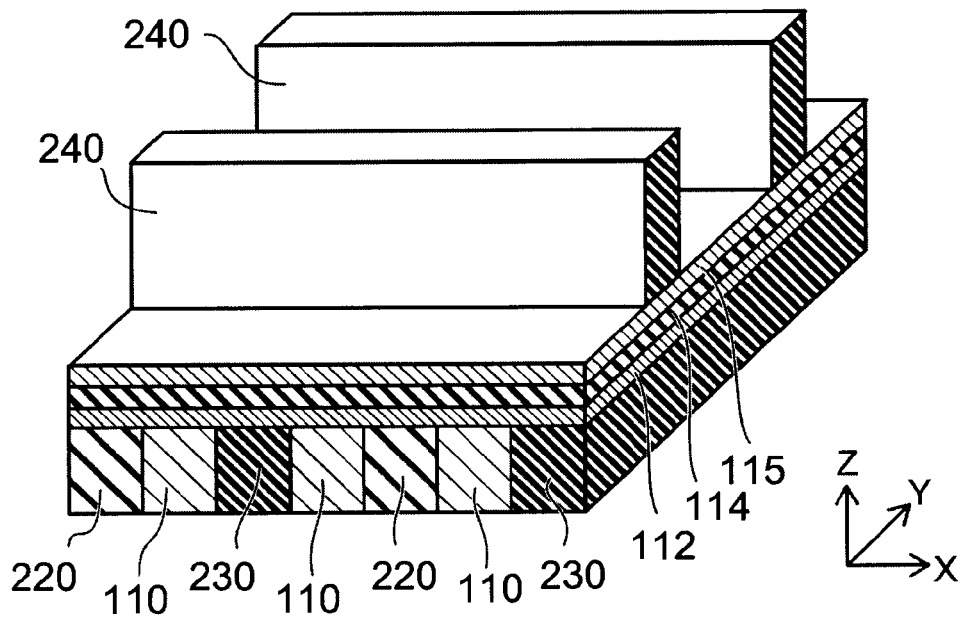

Next, as shown in FIG. 19A, the core member 240 is divided in the direction of Y by the lithography method and the RIE method, and the core member 240 extending in the direction of X is formed. In this stage, the core member 240 intersecting with the wiring layer 110 is formed.

Figure 19B:
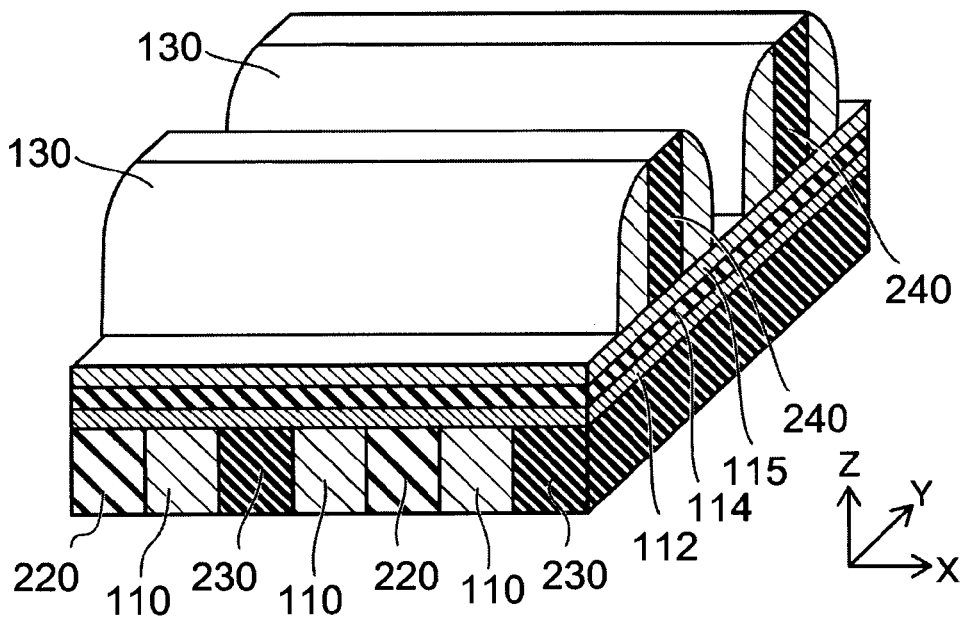

Next, as shown in FIG. 19B, after covering the core member 240 with the wiring layer 130 in such a manner that the film thickness of the wiring layer 130 becomes uniform anyplace, the wiring layer 130 is processed by the RIE method in such a manner that the wiring layer 130 covers the side wall of the core member 240.

Figure 20A:
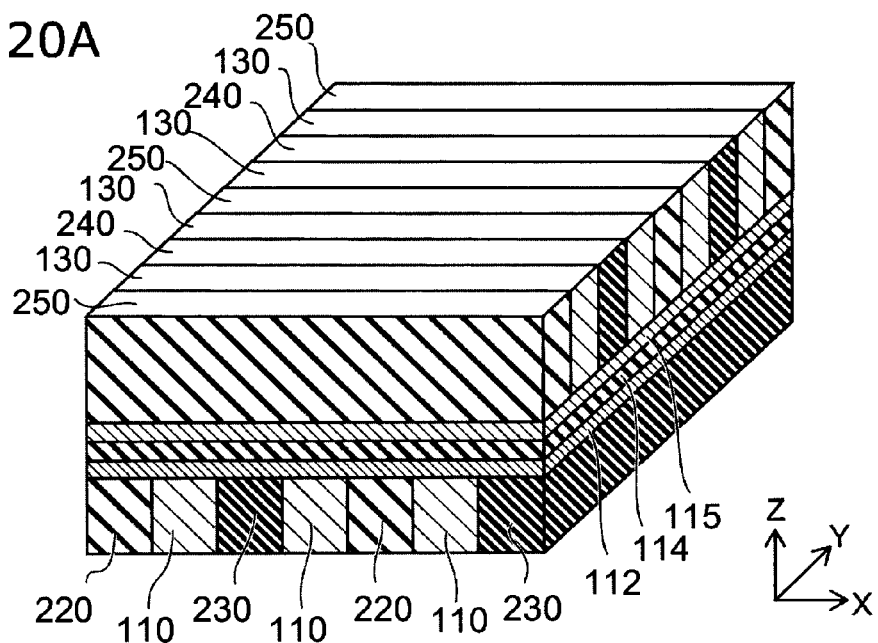

Next, as shown in FIG. 20A, the interlayer insulating film 250 is formed between the adjacent wiring layers 130. Further, the surfaces of the wiring layer 130, the core member 240 and the interlayer insulating film 250 are flattened by the CMP. In this stage, the wiring layer 130 extending in the direction of X is formed.

Figure 20B:
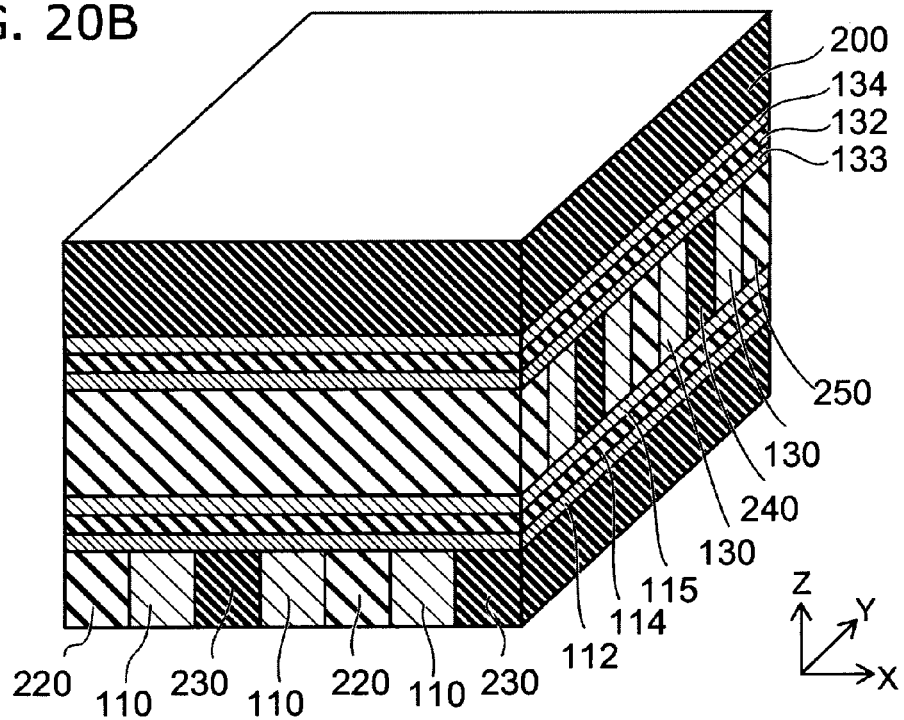

Next, as shown in FIG. 20B, the metal ion supply layer 133, the memory layer 132 and the facing electrode layer 134 are formed on the wiring layer 130, on the core member 240 and on the interlayer insulating film 250. Further, the core member 200 is formed on the facing electrode layer 134.

Figure 21A:
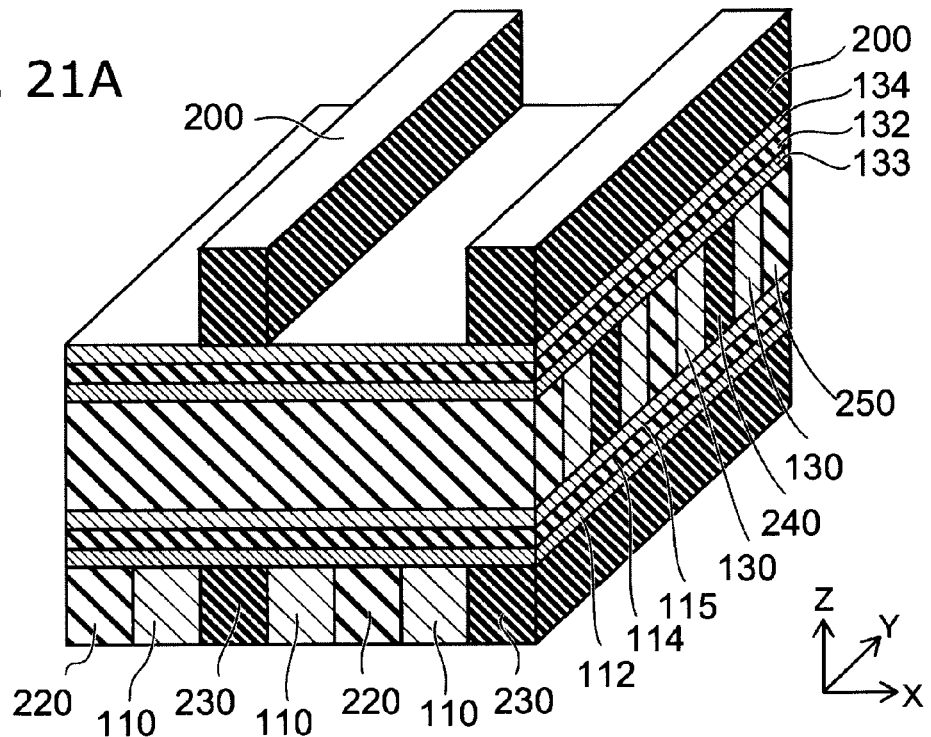

Next, as shown in FIG. 21A, the core member 200 is processed by the lithography method and the RIE method in such a manner as to intersect with the wiring layer 130.

Figure 21B:
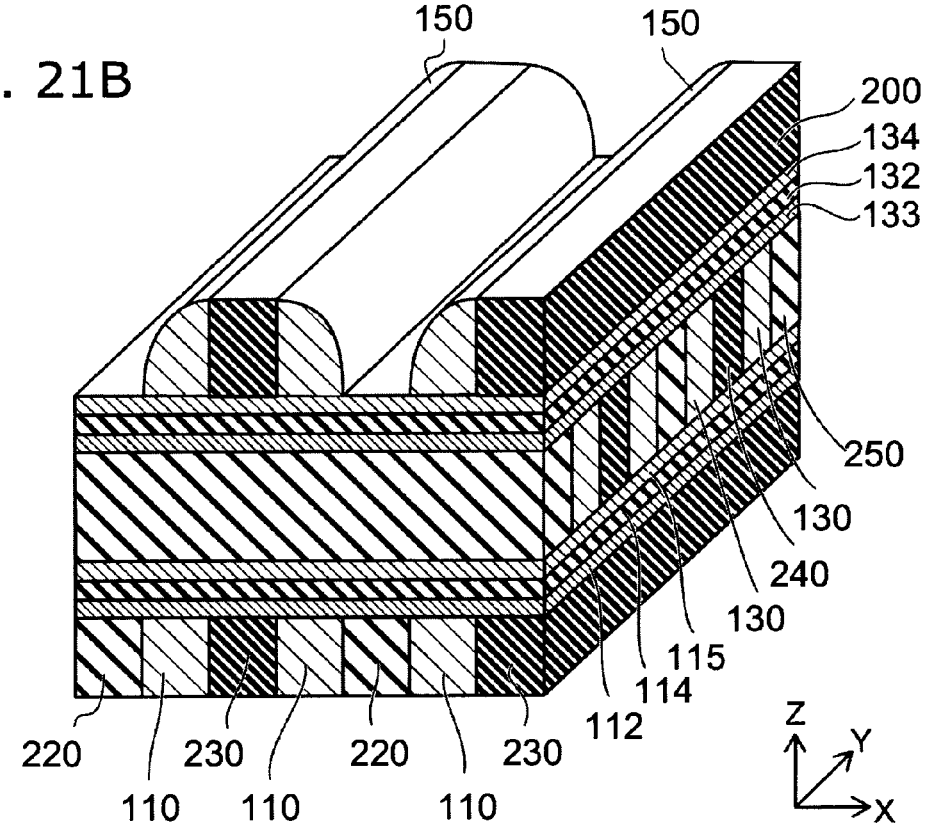

Next, as shown in FIG. 21B, after covering the core member 200 with the wiring layer 150 in such a manner that the film thickness of the wiring layer 150 becomes uniform anyplace, the wiring layer 150 is process by the RIE method in such a manner that the wiring layer 150 covers the side wall of the core member 200.

Figure 22:
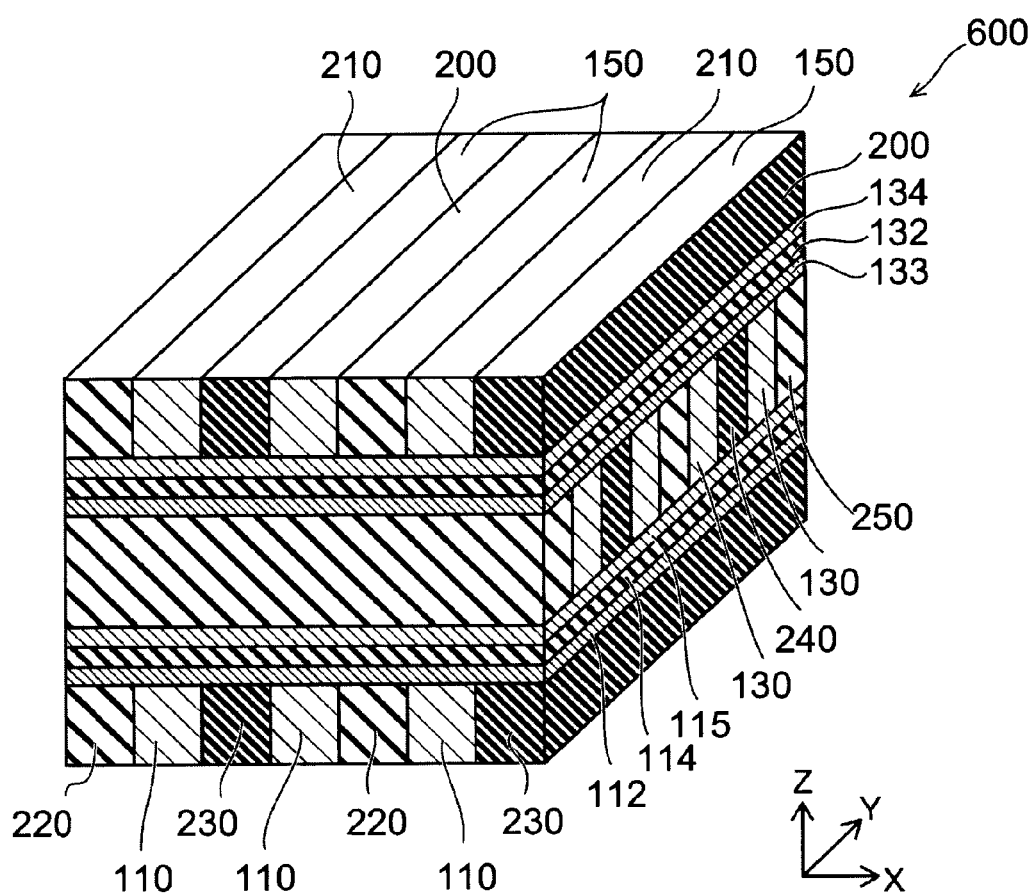

Next, as shown in FIG. 22, the interlayer insulating film 210 is formed between the adjacent wiring layers 150, and the surfaces of the interlayer insulating film 210, the core member 200 and the wiring layer 150 are flattened by the CMP.

In accordance with the manufacturing process mentioned above, a cross point type nonvolatile memory device 600 having two mats and three wirings is formed.

However, in the nonvolatile memory device 600, metal ion supply layers 115 and 133 and facing electrode layers 112 and 134 are installed between the memory cells. Since the metal ion supply layers 115 and 133 and the facing electrode layers 112 and 134 have the electric conductivity, there is a possibility that a current leak is generated between the memory cells in the nonvolatile memory device 600. In order to prevent the current leak, a preventing way is separately necessary.

For example, in order to avoid this, it is necessary to remove the core members 240, 200 before forming the interlayer insulating films 250, 210, and divide the metal ion supply layers 115, 133 and the facing electrode layers 112, 134 by the RIE method by using the wiring layers 130, 150 as a mask member. However, the dividing process mentioned above causes an increase of the number of the process, and generates a cost increase. Further, the method by using the wiring layers 130, 150 as the mask member causes the thinning of the wiring layers 130, 150 due to a so-called film reduction of the wiring layers 130, 150 generated at a time of the RIE. Accordingly, there is a problem that an electric resistance of the wiring layers 130, 150 is increased.

On the contrary, in the second embodiment, each of the facing electrode layers 112, 134 according to the reference example is made in common with each of the wiring layers 110, 150. In other words, the facing electrode layers 112, 134 are incorporated into the wiring layers 110, 150. Further, since the wiring layer 130 itself is set to the metal ion supply source, the metal ion supply layers 115, 133 according to the reference example are not necessary. Further, in the second embodiment, the RIE technique achieving the high selection ratio is also not used, and the hard mask layer 38 is not used in correspondence to this.

Accordingly, the pattern collapse or the like which is listed up in the reference example of the first embodiment can be avoided, and it is possible to achieve the nonvolatile memory device having a high reliability in which the current leak between the memory cells is prevented.

(Third Embodiment)

Figure 23:
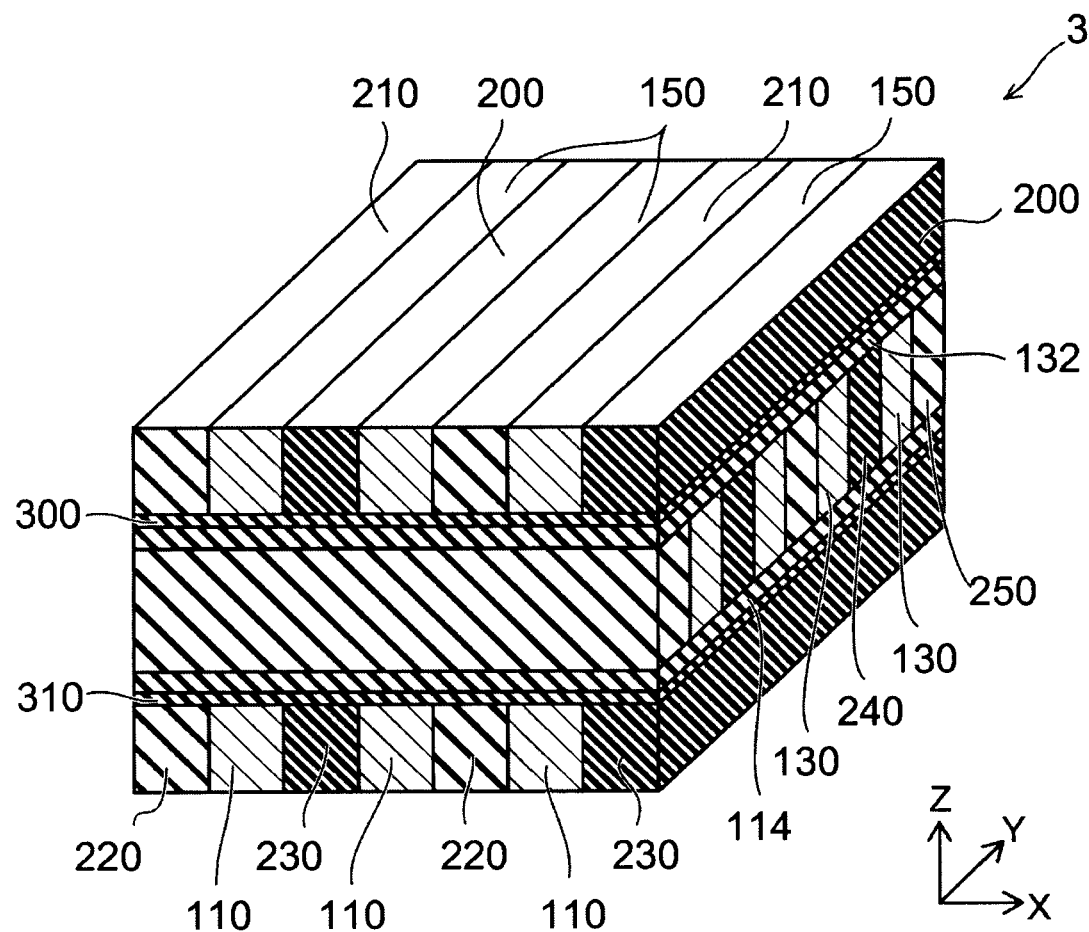
FIG. 23 is a schematically perspective view of a nonvolatile memory device according to a third embodiment.

FIG. 23 is a schematically perspective view of a nonvolatile memory device according to a third embodiment.

A basic configuration of the nonvolatile memory device 3 according to the third embodiment is the same as the nonvolatile memory device 2 according to the second embodiment. In the nonvolatile memory device 3, a diffusion preventing film 300 suppressing a diffusion of the metal ion to the memory layer 132 is provided between the wiring layer 150 and the memory layer 132, and the wiring layer 150 is constructed by the same material as the metal ion supply layer in the same manner as the wiring layer 130. Alternatively, a diffusion preventing film 310 suppressing a diffusion of the metal ion to the memory layer 114 is provided between the memory layer 114 and the wiring layer 110, and the wiring layer 110 is constructed by the same material as the metal ion supply layer in the same manner as the wiring layer 130. The material of the diffusion preventing films 300, 310 is any one of $SiO_2$, $Si_3N_4$ or the like. A film thickness of the diffusion preventing films 300, 310 is set to such a degree of film thickness that does not obstruct a tunnel current while suppressing the diffusion of the metal ion.

In the manufacturing process of the nonvolatile memory device 3, there is incorporated a process including forming the diffusion preventing film 300 between the wiring layer 150 and the memory layer 132, and forming the diffusion preventing film 310 between the memory layer 114 and the wiring layer 110 into the manufacturing process of the nonvolatile memory device 2.

In the case that the diffusion preventing film mentioned above is provided, the writing and the deleting are carried out as follows. For example, with regard to the writing on the memory layer 132, a positive electric potential is applied to the wiring layer 130 which is the bit line, and a negative electric potential is applied to the wiring layer 150 which is the word line. Since the film thickness of the diffusion preventing film 300 is set to such the degree of thin film that does not obstruct the tunnel current, a gradient of an electric field is formed within the memory layer 132. Accordingly, the metal included in the wiring layer 130 is ionized so as to be attracted to the wiring layer 150 side, and the metal ion is introduced into the memory layer 132. Accordingly, the electric resistance of the memory layer 32 is lowered, and the memory layer 32 is going to have a lower conductivity.

On the other hand, if the negative electric potential is applied to the wiring layer 130 which is the bit line, and the positive electric potential is applied to the wiring layer 150 which is the word line, the metal ion introduced into the memory layer 132 is brought back to the wiring layer 130, and reset to the high resistance value before writing. At this time, on the basis of the existence of the diffusion preventing film 300, the metal ion is not introduced into the memory layer 132 from the wiring layer 150. Accordingly, the memory layer 132 gives way to the high resistance from the low resistance.

Further, in the nonvolatile memory device 3, the wiring layer 150 and the wiring layer 110 come to the metal ion supply layer. In other words, in the third embodiment, since the material of the wiring layers 110 and 150 is the same as the material of the wiring layer 130, it is possible to easily make the manufacturing process proceed without changing the material of the wiring layers 110 and 150 and the material of the wiring layer 130.

A description is given of the embodiments while referring to the specific examples. However, the embodiments are not limited to these specific examples. In other words, configurations in which those skilled in the art add design changed appropriately to the specific examples are also included in the scope of the embodiment as long as they are provided with the features of the embodiments. Each of the elements, an arrangement, a material, a condition, a shape, a size and the like thereof provided in each of the specific examples mentioned above are not limited to the illustrated ones, but can be changed appropriately.

Further, each of the elements provided in each of the embodiments mentioned above can be combined as long as being possible legally, and a combination thereof is also included in the scope of the embodiment as long as it includes the feature of the embodiment. In addition, those skilled in the art can derive variations and modifications in the scope of the idea of the embodiments, and it should be understood that the variations and the modifications also belong to the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
a first wiring layer extending in a first direction;
a second wiring layer extending in a second direction and crossing over the first wiring layer; and
a first memory layer provided between the first wiring layer and the second wiring layer;
the first memory layer contacting with the first wiring layer,
the first wiring layer being a layer capable of supplying a metal ion to the first memory layer, and the first wiring layer serving as a bit line.

2. The device according to claim 1, further comprising:
a third wiring layer crossing over the first wiring layer and provided on an opposite side of the second wiring layer;
a second memory layer provided between the first wiring layer and the third wiring layer; and
a metal layer interposed between the first wiring layer and the second memory layer,
the metal layer being a layer capable of supplying a metal ion to the second memory layer.

3. The device according to claim 1, wherein the metal ion is at least one of metal ions selected from a group of Ag, Cu, Ni, Co and Ti.

4. The device according to claim 2, wherein the second wiring layer and the third wiring layer include at least one of metals selected from a group of W, Mo, Al, Ti and Ta.

5. The device according to claim 1, further comprising:
a third wiring layer crossing over the first wiring layer and provided on an opposite side of the second wiring layer; and
a second memory layer provided between the first wiring layer and the third wiring layer,
the second memory layer contacting with the first wiring layer, and
the first wiring layer being a layer capable of supplying the metal ion to the second memory layer.

6. The device according to claim 5, wherein the first wiring layer is provided between an interlayer insulating film and a core member.

7. The device according to claim 5, wherein the second wiring layer is provided between an interlayer insulating film and a core member.

8. The device according to claim 5, wherein the third wiring layer is provided between an interlayer insulating film and a core member.

9. The device according to claim 1, further comprising:
a third wiring layer crossing over the first wiring layer and provided on an opposite side of the second wiring layer;
a second memory layer provided between the first wiring layer and the third wiring layer; and
a diffusion preventing film provided between the second wiring layer and the first memory layer or between the second memory layer and the third wiring layer, and suppressing a diffusion of the metal ion to the first memory layer or the second memory layer.

10. The device according to claim 9, wherein a material of the first wiring layer, a material of the second wiring layer and a material of the third wiring layer are the same.

* * * * *